US007064573B2

(12) United States Patent
Fujita

(10) Patent No.: US 7,064,573 B2
(45) Date of Patent: Jun. 20, 2006

(54) DRIVING CIRCUIT, METHOD OF TESTING DRIVING CIRCUIT, ELECTRO-OPTICAL APPARATUS, AND ELECTRO-OPTICAL DEVICE

(75) Inventor: Shin Fujita, Chino (JP)

(73) Assignee: Seiko Epson Corporation, Tokyo (JP)

( * ) Notice: Subject to any disclaimer, the term of this patent is extended or adjusted under 35 U.S.C. 154(b) by 209 days.

(21) Appl. No.: 10/843,421

(22) Filed: May 12, 2004

(65) Prior Publication Data

US 2004/0257303 A1 Dec. 23, 2004

(30) Foreign Application Priority Data

May 26, 2003 (JP) ............................ 2003-148011

(51) Int. Cl.
*G01R 31/02* (2006.01)

(52) U.S. Cl. ......................... 324/770; 345/87; 345/100

(58) Field of Classification Search .................. 345/87, 345/92, 94, 100, 104; 324/770
See application file for complete search history.

(56) References Cited

U.S. PATENT DOCUMENTS

| | | | | |
|---|---|---|---|---|
| 5,675,353 | A * | 10/1997 | Tanaka et al. | 345/96 |
| 2001/0030636 | A1* | 10/2001 | Ito et al. | 345/87 |
| 2003/0006978 | A1* | 1/2003 | Fujiyoshi | 345/204 |
| 2003/0132906 | A1* | 7/2003 | Tanaka et al. | 345/89 |
| 2004/0183563 | A1* | 9/2004 | Her et al. | 324/770 |
| 2004/0183772 | A1* | 9/2004 | Nakajima et al. | 345/102 |

FOREIGN PATENT DOCUMENTS

| | | |
|---|---|---|
| JP | A 7-20826 | 1/1995 |
| JP | A 8-62580 | 3/1996 |

* cited by examiner

*Primary Examiner*—Vibol Tan
(74) *Attorney, Agent, or Firm*—Oliff & Berridge, PLC

(57) ABSTRACT

To provide a highly-reliable testing method of a level shifter, a driving circuit of an electro-optical panel includes a shift register, a level shifter, and a logic operation device. The shift register sequentially outputs first transfer pulses from a plurality of stages. The level shifter shifts the voltage level of each of sequentially-output first transfer pulses thereby outputting a sequence of second transfer pulses as driving signals. The logic operation device performs a logic operation on sequentially-output second transfer pulses thereby outputting test signals the number of which is smaller than the number of stages of the shift register.

15 Claims, 13 Drawing Sheets

DRIVING CIRCUIT, METHOD OF TESTING DRIVING CIRCUIT, ELECTRO-OPTICAL APPARATUS, AND ELECTRO-OPTICAL DEVICE

BACKGROUND OF THE INVENTION

1. Field of Invention

The present invention relates to a driving circuit to drive an electro-optical panel, such as a liquid crystal panel, a method of testing a driving circuit, an electro-optical apparatus, such as a liquid crystal apparatus including an electro-optical panel and a driving circuit, and an electronic device, such as a liquid crystal projector including an electro-optical apparatus.

2. Description of Related Art

The related art drives an electro-optical panel by using a driving circuit integrally-formed or afterward-mounted on a substrate of the electro-optical panel. One related art technique of testing such a driving circuit is to check whether an image is correctly displayed on an electro-optical panel after completion of producing the electro-optical panel. However, in this technique, when an electro-optical panel has some defect, the defect is not detected until all the production processes are completed, because testing is performed after completion of the production process. Thus, this test method is disadvantageous from the point of view of cost. To avoid the above problem, before final testing is performed on the completed electro-optical panel, testing is generally performed on an array substrate in the middle of production process or before the array substrate is assembled into the final form of the electro-optical panel.

For example, in the case of an electro-optical apparatus having a driving circuit in the form of an integrated circuit produced separately and mounted thereon afterward, a probing test is performed on all integrated circuits to detect a line defect or the like before integrated circuits are mounted.

In the case of electro-optical apparatus having a built-in driving circuit, the operation of the driving circuit produced in the form of an internal circuit is tested before performing the probing test.

The driving circuit to drive the electro-optical panel includes, a data line driving circuit to drive data lines of the electro-optical panel, and a scanning line driving circuit to drive scanning lines of the electro-optical panel. The data line driving circuit and the scanning line driving circuit each include a shift register that sequentially generates, from respective stages thereof, transfer pulses from which to generate a sampling circuit driving signal to control an operation of sequentially driving data lines or a scanning signal to control a sequential scanning operation. For the purpose of reducing power consumption, the built-in driving circuit of the electro-optical apparatus is driven by a low voltage. Thus, the shift registers described above are also driven by a small voltage. Therefore, the voltage level of transfer pulses change within a small range. In order to obtain a swing large enough to drive matrix elements of the electro-optical panel, the voltage level of transfer pulses output from each shift register is shifted by a level shifter disposed at an output end of the shift register.

To test such a built-in circuit or a part thereof including shift registers and level shifters, an end pulse, specifically, a transfer pulse output from the final stage of a shift register is detected. In response, a signal output from one output terminal, which is selected as a test terminal from a plurality of output terminals of the level shifter, is examined.

SUMMARY OF THE INVENTION

However, in the related art method of testing internal circuits, it is impossible to test all signals output from level shifters. Specifically, it is impossible to test all parts of the level shifter. It is difficult to test all other internal circuits, such as a buffer, a waveform shaping circuit, and an inverter, which are disposed between the output of a shift register and an input of a level register.

Thus, in the related art method of testing internal circuits, there is a possibility that a defect of a circuit, such as a level shifter, is detected in testing of the displaying operation of an electro-optical panel after completion of production of the electro-optical panel. This makes it difficult to reduce the production cost.

In view of the above, the present invention provides a driving circuit to drive an electro-optical panel, capable of testing a level shifter thereof in a highly reliable fashion, a method of testing a driving circuit, an electro-optical apparatus using a driving circuit, and various electronic devices including such an electro-optical apparatus.

In a first aspect, to achieve the above, the present invention provides a driving circuit including a shift register to sequentially output first transfer pulses from a plurality of stages of the shift register, a level shifter to shift the levels of the sequentially-output first transfer pulses thereby sequentially outputting second transfer pulses as driving signals, and a logic operation device to perform a logic operation on the sequentially-output second transfer pulses thereby outputting test signals which change with time in response to changes in the sequentially-output second transfer pulses and the number of which is smaller than the number of stages, N, of the shift register.

In this driving circuit according to the first aspect of the present invention, when the driving circuit is in operation, second transfer pulses are sequentially output as driving signals, such as scanning signals, data line driving signals, or sampling circuit driving signals, which are used in sequential driving of an active matrix or the like. When the driving circuit is tested, second transfer pulses are also output. The logic operation device in the driving circuit performs the logic operation by partially splitting the second transfer pulses serving as driving signals, thereby producing the test signal. At a stage before or after producing the test signal, waveform shaping may be performed on the second transfer pulses.

Thus, in this driving circuit according to the first aspect of the present invention, by examining the test signal output from the logic operation device, it is possible to test the driving circuit not only for a part of the shift register or the level shifter as is possible by the related art technique but also for other parts of the level shifter and the overall operation.

In this driving circuit, the logic operation makes it possible to obtain test signals, the number of which is smaller than the number, N, of shift registers. This results in an enhancement in efficiency of testing, compared with the case in which test signals associated with the respective N stages are separately output as test signals. For example, by using only a single test signal in which test signals associated with respective stages of the level shifter appear time-sequentially, it is possible to test all stages of the level shifter 702. Alternatively, two test signals may be used to test all stages of the level shifter, for example, such that one test signal is used to test stages in a right-hand half part of the level shifter and the other test signal is used to test stages in a left-hand half part of the level shifter. Specifically, by performing logical operations in the above-described manner, it becomes possible to perform testing using a smaller number of test signals than the number of the stages, N, of the shift register or that of the level shifter. This is very useful in testing driving circuits. Specifically, in this technique, it is not necessary to provide a large number of test terminals in a limited area of a substrate on which the driving circuit is formed. But it is sufficient to provide only one or a small number of test terminals depending on the number of test signals. This is very advantageous in reducing the circuit size, circuit pitch or interconnection pitch. It is possible to test all stages of the level shifter including all internal circuits, such as a buffer, a waveform shaping circuit, and an inverter, which are disposed together with a level shifter at an input of the logic operation device.

Thus, in this driving circuit according to the first aspect of the present invention, it is possible to test the level shifter thereof in a highly reliable fashion.

In a second aspect, the present invention provides a driving circuit including a shift register to sequentially output first transfer pulses from a plurality of stages of the shift register, and a level shifter to shift the levels of the sequentially-output first transfer pulses thereby sequentially outputting second transfer pulses as driving signals, the level shifter including a logic operation device to perform a logic operation on the sequentially-output second transfer pulses thereby outputting test signals which change with time in response to changes in the sequentially-output second transfer pulses, and the number of which is smaller than the number of stages, N, of the shift register.

In this driving circuit according to the second aspect of the present invention, by examining the test signal output from the logic operation device in the level shifter, it is possible, as with the driving circuit according to the first aspect, to test the driving circuit not only for a part of the shift register or the level shifter as is possible by the related art technique but also for other parts of the level shifter and the overall operation. That is, it is possible to test the level shifter in a highly reliable fashion.

In a mode of the driving circuit according to the first or second aspect of the present invention, the logic operation device may include (N−1) stages of logic circuits that are disposed in correspondence with the stages of the shift register and that sequentially generate transfer signals. A logic circuit at the first stage generates a first-stage transfer signal by performing a logic operation on a second transfer pulse output from a first stage of the level shifter and a second transfer pulse output from a second stage of the level shifter. A logic circuit at the jth stage generates a jth-stage transfer signal by performing a logic operation on a transfer pulse output from an (j−1)th stage of the logic circuit and a second transfer pulse output from a (j+1)th stage of the level shifter, where j=2, . . . , N−1. Finally, a logic operation is performed on a transfer pulse output from an (N−2)th stage of the logic circuit and a second transfer pulse output from an Nth stage of the level shifter, thereby generating an (N−1)th-stage transfer signal as the test signal.

In this driving circuit, by examining the test signal output from the final stage of the logic operation device, it is possible to easily test whether part or all of stages of the shift register and the level shifter operate correctly. Because the test signal output from the final stage includes pulse components which appear sequentially in time and which originate from respective stages from the first stage to the final stage, the level shifter can be tested for its all stages by examining the test signal, not at a particular instant, but over a period of one cycle of the operation of the level shifter.

In this mode of the driving circuit, the logic operation device generates the test signal such that when the shift register and the level shifter operate correctly, the test signal is in the form of a sequence of second transfer pulses starting with the first-stage second transfer pulse and ending with the Nth-stage second transfer pulse.

Specifically, when the shift register and the level shifter operate correctly, the test signal changes with time in accordance with the second transfer pulses sequentially output from the level shifter, that is, the test signal output from the final stage of the logic operation device is in the form of a sequence of pulses starting with a second transfer pulse originating from the first stage and ending with a second transfer pulse originating from the Nth stage. Therefore, when the shift register or the level shifter includes an abnormal part, the abnormal part of the shift register or the level shifter can be identified by detecting an abnormal pulse component appearing in a particular position in time in the test signal. Specifically, it is possible to identify which stage of the shift register or the level shifter has a failure. Furthermore, in this driving circuit, it is also possible to identify a cause of a failure in the shift register or the level shifter by examining the voltage level of the test signal.

In another mode of the driving circuit according to the first or second aspect of the present invention, the logic circuits are formed using NOR circuits and perform the logic operation on the second transfer pulses in positive logic.

In this mode of the driving circuit, when the shift register and the level shifter operate correctly, the logic operation device outputs a test signal in the form of a sequence of positive-logic pulses starting with a second transfer pulse output from the first stage and ending with a second transfer pulse output from the Nth stage.

In another mode of the driving circuit according to the first or second aspect of the present invention, the logic circuits are formed using NAND circuits and perform the logic operation on the second transfer pulses in negative logic.

In this mode of the driving circuit, when the shift register and the level shifter operate correctly, the logic operation device outputs a test signal in the form of a sequence of negative-logic pulses starting with a second transfer pulse output from the first stage and ending with a second transfer pulse output from the Nth stage.

In another mode of the driving circuit according to the first or second aspect of the present invention, the logic circuits are formed using NOR circuits and NAND circuits such that the NOR circuits perform the logic operation on the second transfer pulses in positive logic. The NAND circuits perform the logic operation on the second transfer pulses in negative logic.

In this mode of the driving circuit, when the shift register and the level shifter operate correctly, the logic operation device outputs a test signal in the form of a sequence of positive-logic pulses starting with a second transfer pulse output from the first stage and ending with a second transfer pulse output from the Nth stage, and a sequence of negative-logic pulses starting with a second transfer pulse output from the first stage and ending with a second transfer pulse output from the Nth stage.

In another mode of the driving circuit according to the first or second aspect of the present invention, the shift register is configured to be capable of sequentially outputting the first transfer pulses selectively in a forward or reverse direction from the plurality of stages.

In this mode of the driving circuit, when the shift register operates in a forward transfer mode in which first transfer pulses are sequentially output in the forward direction in response to a transfer start pulse, the level shifter operating in the forward operation mode can be tested for all stages thereof by examining the test signal output from the logic operation device. Similarly, when the shift register operates in a reverse transfer mode in which first transfer pulses are sequentially output in the reverse direction in response to a transfer start pulse, the level shifter operating in the reverse operation mode can be tested for all stages thereof by examining the test signal output from the logic operation device.

In another mode according to the first or second aspect of the present invention, the driving circuit may include an enabling device to control waveforms of (j−1)th, jth, and (j+1)th pulses of the first transfer pulse sequence or, instead, controlling waveforms of (j−1)th, jth, and (j+1)th pulses of the driving signals so that there is no overlap in time among the period during which the (j−1)th driving signal is output, the period during which the jth driving signal is output, and the period during which the (j+1)th driving signal is output.

In this mode of the driving circuit, the waveform control performed by the enable device reduces or prevents successive driving signals from being output at the same time thereby reducing or preventing an occurrence of a ghost or the like. If such an enable device is disposed on the input side of the logic operation device, when testing is performed, all stages of the enable device are tested together with the level shifter.

In another mode according to the first or second aspect of the present invention, the driving circuit may include a sampling circuit including CMOS (Complementary Metal-Oxide Semiconductor) switching elements coupled with respective data lines of an electro-optical panel, and an output control device. A positive sampling signal, corresponding to the driving signal, is applied to one of thin film transistors that are different in conduction type and that form each CMOS switching element. A negative sampling signal, that is a logically inverted signal of the positive sampling signal, is applied to the other one of the thin film transistors that are different in conduction type and that form each CMOS switching element, in response to the positive and negative sampling signals, each CMOS switching element samples an image signal supplied from the outside and supplies the resultant sampled image signal over a data line corresponding to the CMOS switching element. The output control device controls output of the positive and negative sampling signals such that the positive and negative sampling signals are synchronously applied to the CMOS switching elements.

In this mode of the driving circuit, in the sampling circuit, a positive sampling signal and a negative sampling signal are applied to each CMOS switching element. If a deviation in phase between those two signals occurs, it becomes impossible to correctly turn on/off the CMOS switching element. To reduce the likelihood or prevent such a deviation, the output control device controls the positive and negative sampling signals such that there is no phase deviation between them, and thus the positive sampling signal and the negative sampling signal are synchronously applied to the CMOS switching element. Thus, in this mode of the driving circuit, it is possible to turn on/off the CMOS switching element in a highly reliable fashion. In the case in which such output control device is disposed on the input side of the logic operation device, when testing is performed, all stages of the output control device are tested together with the level shifter.

In order to achieve the above, an aspect of the present invention also provides an electro-optical apparatus including a driving circuit according to the first or second aspect (and also in any mode described above), and an electro-optical panel driven by sequentially-output driving signals.

In the electro-optical apparatus according to an aspect of the present invention, the driving circuit according to the first or second aspect of the invention allows the level shifter to be tested for its all stages, for example, before the panel is assembled or in the middle of production process. This reduces the likelihood or prevents an electro-optical panel from being produced without detecting a failure in the driving circuit included as an internal circuit in the electro-optical panel. Therefore, it becomes possible to produce the electro-optical apparatus at a reduced cost.

In order to achieve the above, an aspect of the present invention also provides an electronic device including an electro-optical apparatus according to an aspect of the present invention (and also in various modes).

Specific examples of electronic devices produced at low cost using the above-described electro-optical apparatus according to an aspect of the present invention includes a projection-type display, a liquid crystal television set, a portable telephone, an electronic notebook, a word processor, a video tape recorder with a view-finder or a monitor display, a work station, a video telephone, a POS terminal, and a touch panel. An electrophoretic device, such as electronic paper can also be realized as an electronic device according to an aspect of the present invention.

In order to achieve the above, an aspect of the present invention also provides a method of testing the driving circuit according to the first or second aspect (and in various modes) of the present invention, including sequentially outputting first transfer pulses from the shift register, sequentially outputting second transfer pulses via the level shifters, and producing a test signal by performing, using logic operation device, a logic operation on the sequentially-output second transfer pulses and outputting the resultant test signal.

In this test method according to an aspect of the present invention, by examining the test signal output in the outputting the test signal by performing the logic operation, it is possible to not only test whether a part of the shift register and the level shifter operates correctly as is possible by the related art technique, but it is also possible, as with the driving circuit according to the first aspect or the second aspect of the present invention, to test whether the other part of the level shifter operates correctly and whether the overall operation is correct. Thus, a high-reliability testing method of the level shifter is provided.

In a mode of the test method according to an aspect of the present invention, the method may include identifying an abnormal part of the level shifter on the basis of an abnormal part, in terms of voltage level as measured as a function of time, of the output test signal.

This mode of test method makes it unnecessary, when a failure is detected in the level shifter, to perform additional testing to identify the location at which the failure occurs, and it is possible to quickly repair the identified abnormal part.

In another mode of the test method according to an aspect of the present invention, the method may include identifying a cause of an abnormal part of the level shifter on the basis of an abnormal part, in terms of voltage level, of the output test signal.

This mode of test method makes it unnecessary, when a failure is detected in the level shifter, to perform additional testing to identify the cause of the failure, and it is possible to quickly repair the identified abnormal part in the level shifter.

These and other features and advantages of the present invention will become more apparent from the following detailed description referring to exemplary embodiments.

DETAILED DESCRIPTION OF EXEMPLARY EMBODIMENTS

The present invention is described in further detail below with reference to the drawings. In the exemplary embodiments described below, by way of example, an electro-optical apparatus according to an aspect of the present invention is applied to a TFT active matrix liquid crystal apparatus.

1: First Exemplary Embodiment

An electro-optical apparatus according to a first exemplary embodiment of the present invention is described below with reference to FIGS. 1 to 7.

1-1: Structure of Liquid Crystal Apparatus

First, with reference to FIG. 1, the general structure of the electro-optical apparatus according to an aspect of the present invention is described below.

Figure 1:
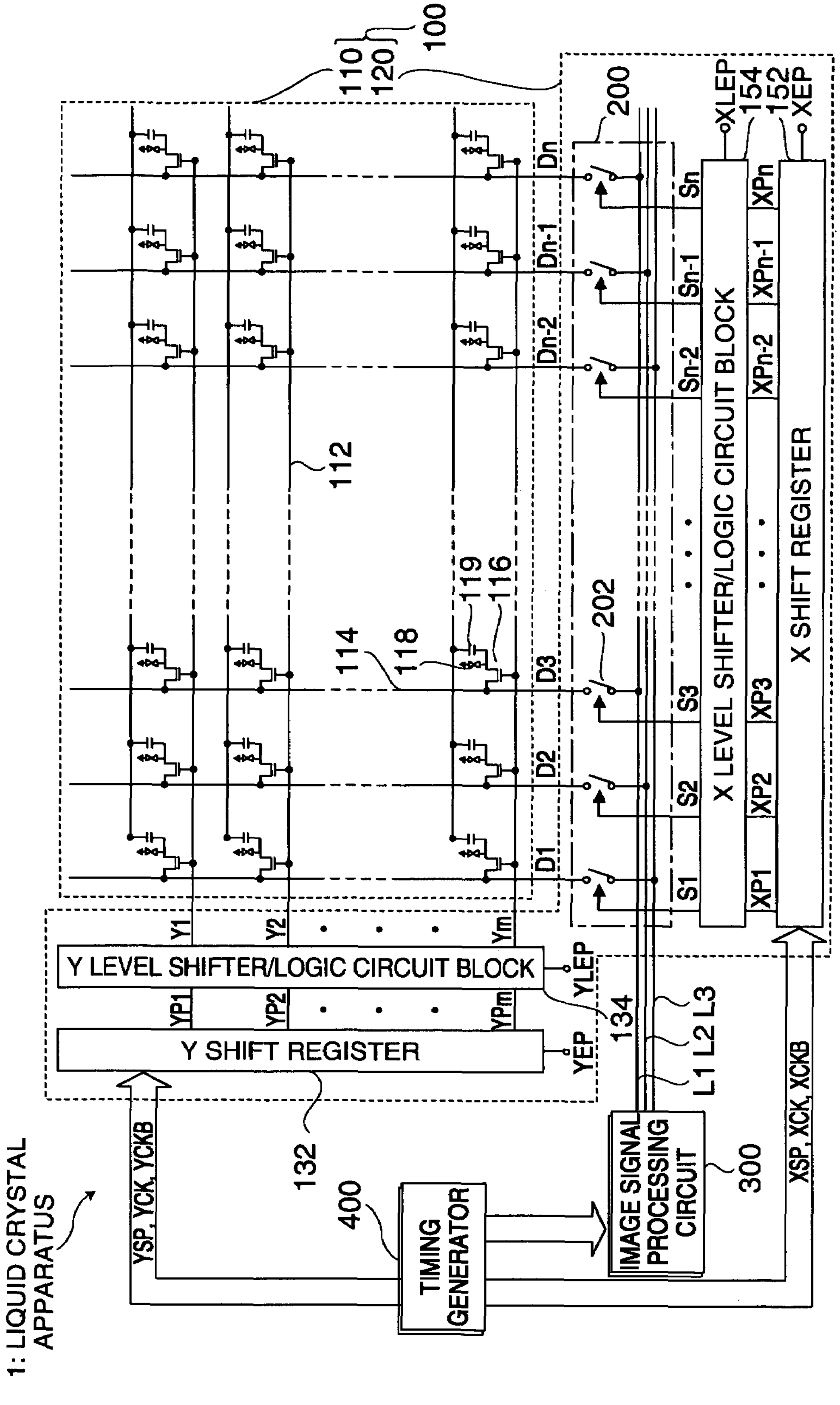
FIG. 1 is a schematic illustrating the general structure of a liquid crystal apparatus according to a first exemplary embodiment of the present invention.

FIG. 1 is a schematic illustrating the general structure of the liquid crystal apparatus according to the present exemplary embodiment.

As shown in FIG. 1, a liquid crystal apparatus 1 includes, a liquid crystal panel 100 that is an example of an electro-optical panel according to the present invention, an image signal processing circuit 300, and a timing generator 400.

The liquid crystal panel 100 includes a device substrate and an opposite substrate. TFTs 116 functioning as switching elements for switching pixels, pixel electrodes, and other elements are formed in an image display area 110 of the device substrate. An opposite electrode and other elements are formed on a surface of the opposite substrate. The device substrate and the opposite substrate are bonded with each other such that they are spaced a particular distance from each other and such that the surfaces on which elements such as the opposite electrode are formed face with other. A liquid crystal is filled in the gap between those two substrates.

The timing generator 400 outputs various timing signals to be used in various parts. The timing generator 400 includes timing signal output device. The timing signal output device generates a dot clock signal that is a most basic clock signal to control the timing of scanning the pixels. On the basis of the dot clock signal, various timing signals, such as a Y clock signal YCK, an inverted Y clock signal YCKB, an X clock signal XCK, an inverted X clock signal XCKB a Y transfer start pulse YSP, and an X transfer start pulse XSP are generated.

If image data input from the outside is applied to the image signal processing circuit 300, the image signal processing circuit 300 generates image signals including an R signal, a G signal, and a B signal corresponding respectively to RGB colors in accordance with the input image data. Although not shown in the figure for the purpose of simplicity, the input image data applied to the image signal processing circuit 300 may be converted, by means of serial to parallel conversion, into a multiphase image signal. The image signals output from the image signal processing circuit 300 include the R signal, the G signal, and the B signal corresponding respectively to RGB colors in accordance with the input image data. The R signal, the G signal, and the B signal are respectively supplied from the image signal processing circuit 300 to the liquid crystal panel 100 via corresponding three image signal supply lines L1, L2, and L3 formed on the liquid crystal apparatus 1.

In the present exemplary embodiment, the liquid crystal panel 100 is of a type including a build-in driving circuit. That is, a driving circuit 120, which is an example of the “driving circuit” according to an aspect of the present invention, is formed on the device substrate of the liquid crystal panel 100, the driving circuit 120 including an X shift register 152, a Y shift register 132, an X level shifter/logic operation circuit block 154, a Y level shifter/logic operation circuit block 134, and a sampling circuit 200. When the TFTs 116 associated with the respective pixels are produced in the image display area 110, the driving circuit 120 may be simultaneously produced in a peripheral area on the device substrate. Note that a part or all of the driving circuit may be formed separately in the form of an integrated circuit, and the integrated circuit may be mounted in the peripheral area on the device substrate.

The liquid crystal panel 100 further includes data lines 114 and scanning lines 112 extending vertically and horizontally in the image display area 110 occupying a central part of the device substrate. Pixel electrodes 118 and TFTs 116 to switch the corresponding pixel electrodes 118 are formed in respective pixels corresponding to intersections of the data lines 114 and the scanning lines 112. Thus, the pixel electrodes 118 and the TFTs 116 are arranged in the form of a matrix array. In response to X driving signals, which will be described later, the sampling circuit 200 samples the R signal, the G signal, and the B signal supplied via the image signal supply lines L1, L2, and L3, respectively, and supplies the resultant sampled signals over the data lines 114. The details of the operation of the liquid crystal apparatus will be described later.

The source electrode of each TFT 116 is electrically connected with a data line 114 through which one of the R signal, the G signal, and the B signal is supplied. The gate electrode of each TFT 116 is electrically connected with a scanning line 112 through which a scanning signal, which will be described later, is supplied. The drain electrode of each TFT 116 is connected with a pixel electrode 118. Each of pixels, which are located close to respective intersections of the scanning lines 112 and the data lines 114 and thus which are arranged in the form of a matrix array, is formed of one pixel electrode 118, a common electrode formed on the opposite substrate, and a liquid crystal disposed between those two electrodes.

To ensure that an image signal is retained without having significant decay, a storage capacitor 119 is formed in each pixel such that it is added in parallel with liquid capacitance formed between the pixel electrode 118 and the opposite electrode.

A voltage on the pixel electrode 118 is retained by the storage capacitor 119 for a period three orders of magnitude longer than a period during which a source voltage is applied. This enhancement in storage characteristic makes it possible to achieve a high contrast ratio.

The driving circuit 120 is formed in the outside of the image display area 110 and includes the X shift register 152, the Y shift register 132, the X level shifter/logic operation circuit block 154, the Y level shifter/logic operation circuit block 134, and the sampling circuit 200. Active elements of those circuits may be realized by a combination of p-channel TFTs and n-channel TFTs, and may be produced by the same production process by which the TFTs 116 for switching pixels are produced. This is advantageous in terms of integration, cost, and uniformity of element characteristics.

The X clock signal XCK, the inverted X clock signal XCKB, and the X transfer start pulse XSP, output by the timing generator 400, are applied to the X shift register 152 of the driving circuit 120. In response to receiving the X transfer start pulse XSP, the X shift register 152 sequentially produces first X transfer pulses XP1, XP2, XP3, . . . , XPn−2, XPn−1, XPn in synchronization with the X clock signal XCK and the inverted X clock signal XCKB.

The X level shifter/logic operation circuit block 154 shown in FIG. 1 includes X level shifters and X logic operation device. X level shifters in the X level shifter/logic operation circuit block 154 sequentially output second X transfer pulses by shifting the voltage levels of the respective first X transfer pulses XP1, XP2, XP3, . . . , XPn−2, XPn−1, XPn that are sequentially output from the X shift register 152.

The X logic operation device in the X level shifter/logic operation circuit block 154 performs a logic operation on the second X transfer pulses sequentially output form the X level shifters thereby generating X test signals XLEP.

The X level shifter/logic operation circuit block 154 also includes an X enable device to control waveforms of the first X transfer pulses. The details of the X enable device will be described later.

In the present exemplary embodiment, n data lines 114 are formed in the image display area 110 (where n is an integer equal to or greater than 2). The sampling circuit 200 includes n switching elements (sampling switches) 202 corresponding to the respective n data lines 114. The input terminal of each of the n switching elements 202 is electrically connected with one of the image signal supply lines L1, L2, and L3. In the present exemplary embodiment, each switching element 202 is formed in a CMOS configuration.

Furthermore, in the present exemplary embodiment, the X level shifters sequentially output X driving signals corresponding to the respective n CMOS switching elements 202. The X level shifter/logic operation circuit block 154 also includes an output control device to control outputting of the X driving signals from the X level shifters and also controlling outputting of logically inverted signals thereof, as will be described in further detail later. The output control device sequentially outputs two types of signals.

The signals output from the output control device are applied to the respective CMOS switching elements. That is, in the present exemplary embodiment, signals output from the output control device are output from the X level shifter/logic circuit block 154 and applied to one of n CMOS switching elements 202. Note that in FIG. 1, each pair of output signals sequentially output from the output control device is denoted simply by a single sampling signal Si.

In the present exemplary embodiment, if a sampling signal Si is applied to a CMOS switching element 202, an image signal on the image signal line L1, L2, or L3 corresponding to this CMOS switching element 202 is sampled and the image signal is applied to a data line 114 corresponding to this CMOS switching element 202.

The structures and the operations of the X shift register 152, the X level shifters and the X logic operation device in the X level shifter/logic operation circuit block 154, the X enable device, and the output control device will be described in further detail later.

In the present exemplary embodiment, the structures and the operations of the Y shift register 132 and the Y level shifter/logic operation circuit block 134 in the driving circuit 120 are similar to those of the X shift register 152 and the X level shifter/logic operation circuit block 154.

When a Y transfer start pulse YSP is applied to the Y shift register 132, the Y shift register 132 sequentially produces first Y transfer pulses YP1, YP2, . . . , YPm in synchronization with the Y clock signal YCK and the inverted Y clock signal YCKB.

The voltage levels of the first Y transfer pulses YP1, YP2, . . . , YPm sequentially output from the Y shift register 132 are shifted by the respective Y level shifters 134 in the Y level shifter/logic operation circuit block 134. Thus, the Y level shifters sequentially output second Y transfer pulses as Y driving signals.

In the present exemplary embodiment, m scanning lines 112 are formed in the image display area 110 (where m is an integer equal to or greater than 2). The Y level shifters sequentially output scanning signals Y1, Y2, . . . , Ym as Y driving signals, which are applied to the m scanning lines 112.

The Y logic operation device in the Y level shifter/logic operation circuit block 134 performs a logic operation on the second Y transfer pulses sequentially output from the Y level shifters thereby generating Y test signals YLEP.

Also in the Y level shifter/logic operation circuit block 134, as in the X level shifter/logic operation circuit block 154, the Y enable device controls the waveform of the first Y transfer pulses, as will be described in detail later.

The structures and the operations of the Y shift register 132, the Y level shifters and the Y logic operation device in the Y level shifter/logic operation circuit block 134, and the Y enable device will be described in further detail later.

Figure 2:
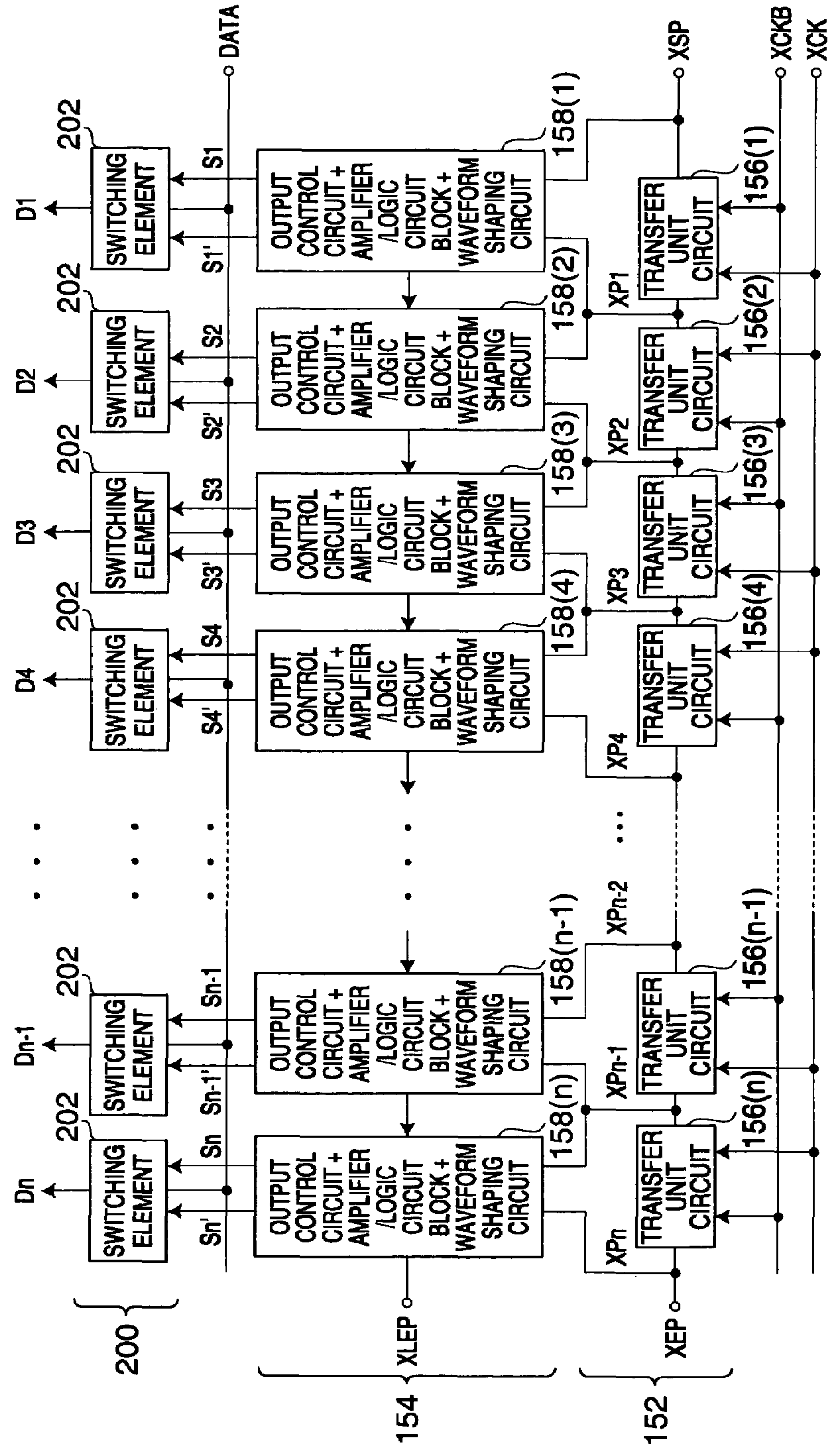
FIG. 2 is a schematic showing the configuration of an X shift register and an X level shifter/logic operation circuit block according to the first exemplary embodiment of the present invention.
Figure 3:
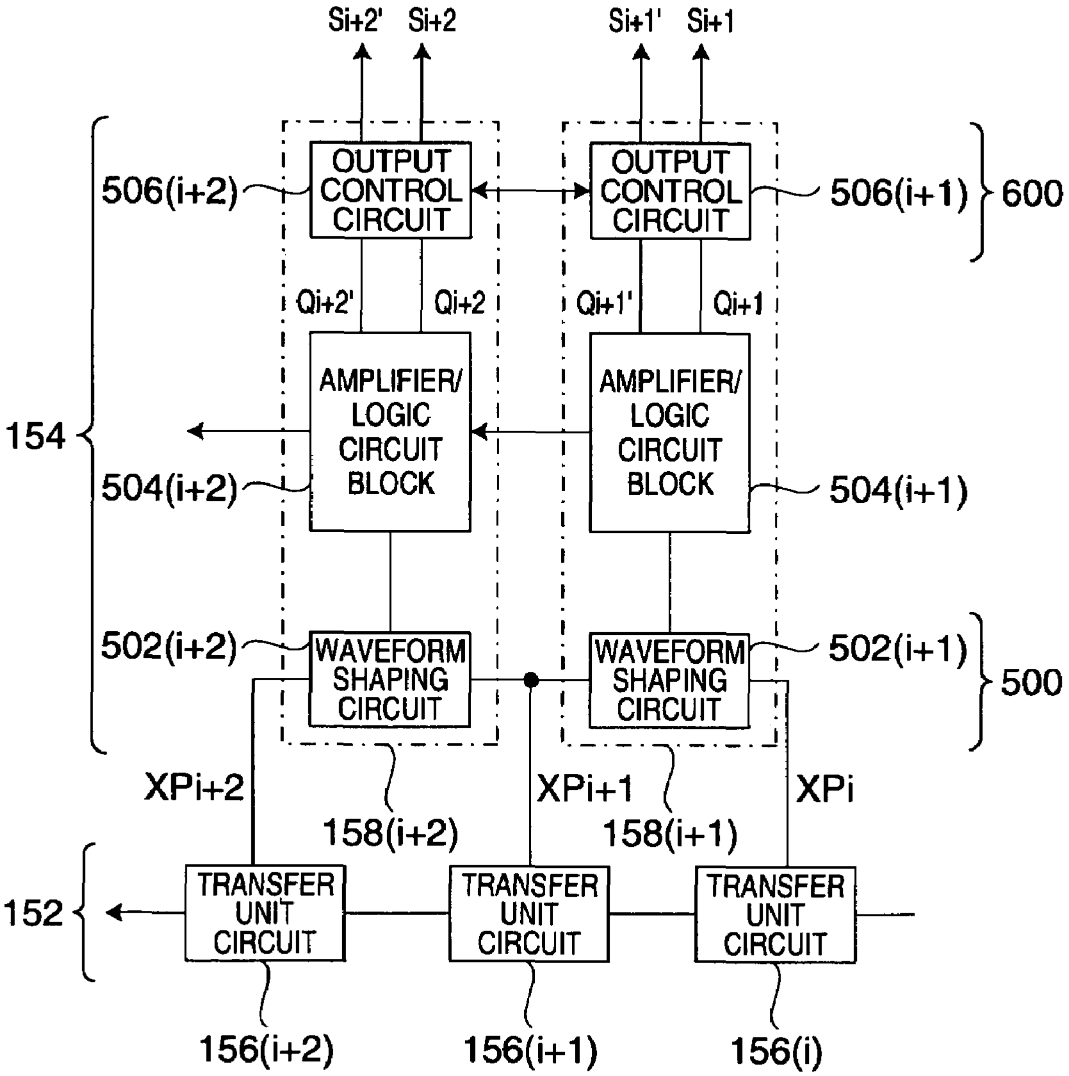
FIG. 3 is a schematic showing the detailed configuration of the X shift register and the X level shifter/logic operation circuit block according to the first exemplary embodiment of the present invention.

1-2: Structure of X Shift Register and Structure of X Level Shifter/Logic Operation Circuit Block Referring to FIGS. 2 and 3, the structure of the X shift register 152 and the structure of the X level shifter/logic operation circuit block 154 are described in detail below. FIG. 2 shows the detailed structure of the X shift register 152 and the X level shifter/logic operation circuit block 154. FIG. 3 shows the detailed structure of the X level shifter/logic operation circuit block 154.

As shown in FIG. 2, the X shift register 152 is constructed in the form of an n-stage shift register, each stage formed by a transfer unit circuit 156. Each of the n transfer unit circuits 156 is driven by electric power supplied from a high-voltage power supply and a low-voltage power supply, although those power supplies are not shown in FIGS. 1 and 2. Specifically, each of the n transfer unit circuits 156 is driven by a high voltage Vdd supplied by the high-voltage power supply and a low voltage Vss supplied by the low-voltage power supply.

In the X shift register 152, first X transfer pulses XP1, XP2, XP3, XP4, . . . , XPn−2, XPn−1, XPn are sequentially output from the transfer unit circuits 156(*i*) (i=1, 2, . . . , n) at the respective stages in the transfer direction from the transfer unit circuit 156(1) at the first stage toward the transfer unit circuit 156(*n*) at the Nth stage.

As shown in FIG. 2, the X level shifter/logic operation circuit block 154 is formed in an n stage configuration, each stage formed by a unit circuit 158 including a waveform shaping circuit, an amplifier/logic circuit block, and an output control circuit.

The unit circuit 158 shown in FIG. 2 is described in further detail below with reference to FIG. 3. FIG. 3 shows the detailed structure of the unit circuit 158, the unit circuit 158(*i*+1) at the (*i*+1)th stage of the X level shifter/logic operation circuit block 154 shown as an example of the unit circuit 158.

As described above, the X level shifter/logic operation circuit block 154 includes X enable device and output control device. In the present exemplary embodiment, each X enable device 500 is realized by a waveform shaping circuit 502 included in the unit circuit 158(*i*) at each stage of the X level shifter/logic operation circuit block 154. The output control device 600 is realized by an output control circuit 506 included in the unit circuit 158(*i*) at each stage of the X level shifter/logic operation circuit block 154.

In the unit circuit 158(*i*+1) at the (*i*+1)th stage shown in FIG. 3, the waveform shaping circuit 502(*i*+1) controls the waveform of the (*i*+1)th first-X-transfer-pulse XPi+1 in accordance with ith first-X-transfer-pulse XPi output from the transfer unit circuit 156(*i*) at the ith stage and (i+1)th first-X-transfer-pulse XPi+1 output from the transfer unit circuit 156(*i*+1) at the (i+1)th stage.

In the unit circuit 158(*i*) at each stage of the X level shifter/logic operation circuit block 154, each amplifier/logic circuit block 504(*i*) is driven by a matrix voltage Vhh–Vll that is the difference between a high voltage Vhh supplied by a high-voltage power supply and a low voltage Vll supplied by a low-voltage power supply, although those power supplies are not shown in FIGS. 2 and 3. Alternatively, the amplifier/logic circuit block 504(*i*) may be driven by the matrix voltage Vss–Vhh such that the voltage level is shifted only to a higher voltage level, or may be driven by the matrix voltage Vll–Vdd such that the voltage level is shifted only to a lower voltage level.

In the unit circuit 158(*i*+1) at the (i+1)th stage, the amplifier/logic circuit block 504(*i*+1) shifts the voltage level Vdd–Vss of the signal output from the waveform shaping circuit 502(*i*+1) to the voltage level Vhh–Vll thereby generating an (i+1)th second-X-transfer-pulse. The amplifier/logic circuit block 504(*i*+1) outputs the resultant signal as an X driving signal Qi+1. When the amplifier/logic circuit block 504(*i*+1) outputs the (i+1)th X driving signal Qi+1, the amplifier/logic circuit block 504(*i*+1) also outputs an inverted logical signal Qi+1' thereof.

In the unit circuit 158(*i*+1) at the (i+1)th stage, the output control circuit 506(*i*+1) adjusts the phase of the (i+1)th X driving signal Qi+1 output from the amplifier/logic circuit block 504(*i*+1) and the phase of its logically inverted signal Qi+1' such that those signals become equal in phase to each other. The output control circuit 506(*i*+1) then generates an (i+1)th positive sampling signal Si+1 as an output signal corresponding to the (i+1)th X driving signal Qi+1 and also generates an (i+1)th negative sampling signal Si+1' as an output signal corresponding to the logically inverted signal Qi+1' of the (i+1)th X driving signal Qi+1.

The unit circuit 158(i+2) at the (i+2)th stage in the X level shifter/logic circuit block 154 is similar, in terms of structure and operation, to the unit circuit (i+1) at the (i+1)th stage.

Referring again to FIG. 2, positive sampling signals S1, S2, S3, S4, . . . , Sn−1, Sn and negative sampling signals S1', S2', S3', S4', . . . , Sn−1', Sn' are sequentially output from the unit circuits 158 at the respective stages of the X level shifter/logic circuit block 154 in the direction from the first stage to the Nth stage.

The sequentially-output positive sampling signals S1, S2, S3, S4, . . . , Sn−1, Sn are respectively input to the corresponding switching elements 202. The sequentially-output negative sampling signals S1', S2', S3', S4', . . . , Sn−1', Sn' are also input to the corresponding switching elements 202.

The positive sampling signal Si and the negative sampling signal Si' input to the same CMOS switching element 202 are equal in phase. The positive sampling signal Si and the negative sampling signal Si' are input to each CMOS switching element 202 in synchronization with each other. This technique used in the present exemplary embodiment ensures that the CMOS switching elements 202 of the sampling circuit 200 are correctly turned on/off.

Note that in FIG. 2, for the purpose of simplicity, the image signal supply lines L1, L2, and L3 shown in FIG. 1 are denoted simply by a single image signal line, and the R signal, the G signal, and the B signals are denoted simply by DATA.

In the configuration shown in FIG. 2, the image signals D1, D2, D3, D4, . . . , Dn−1, Dn are sequentially output from the respective CMOS switching elements 202 of the sampling circuit 200. In the image display area 110, as shown in FIG. 1, the image signals D1, D2, D3, D4, . . . , Dn−1, Dn output from the CMOS switching element 202 of the sampling circuit 200 are sequentially applied to the n respective data lines 114.

1-3: Structure of Y Shift Register and Y Level Shifter/Logic Circuit Block

Figure 4:
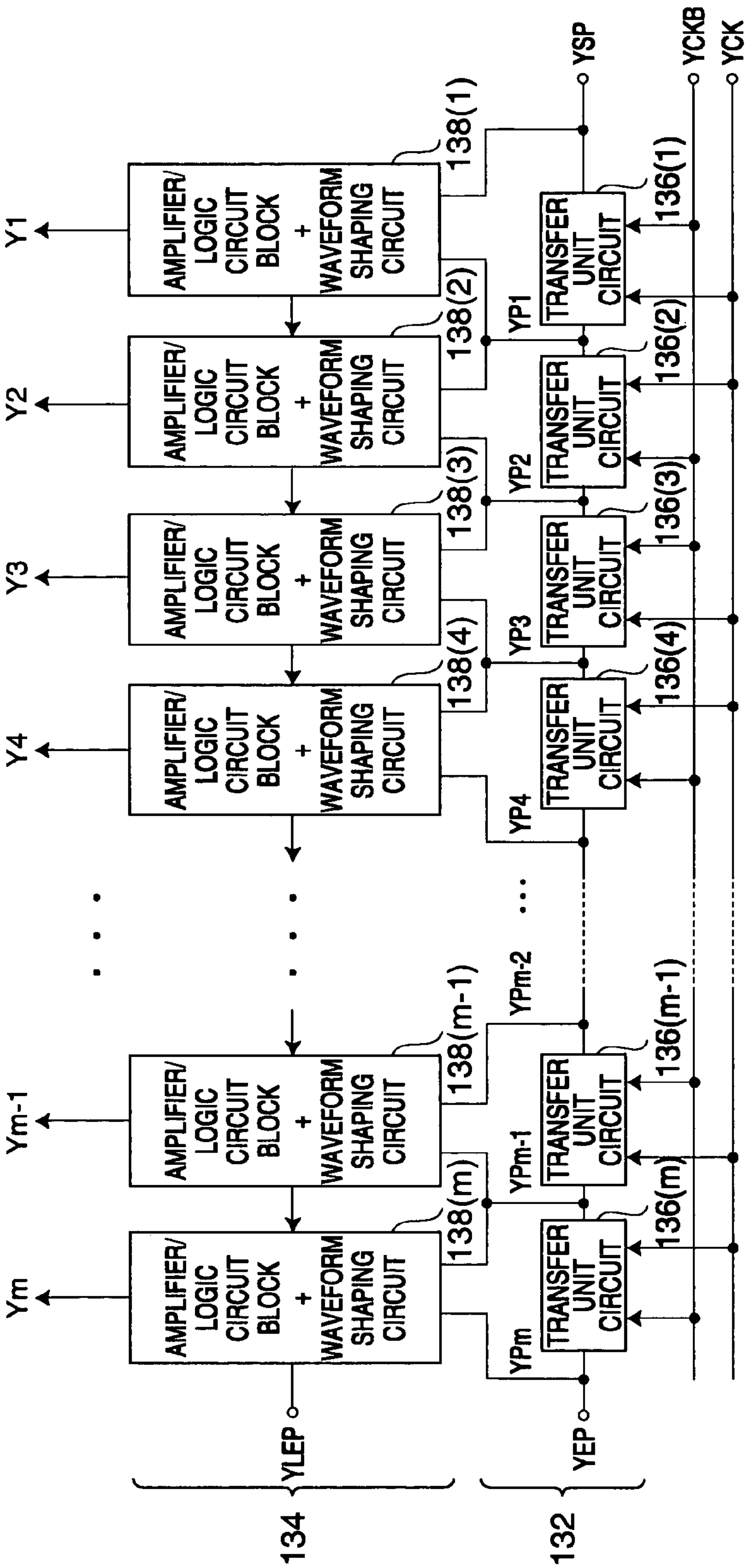
FIG. 4 is a schematic showing the configuration of a Y shift register and a Y level shifter/logic operation circuit block according to the first exemplary embodiment of the present invention.

Now, the Y shift register 132 and the Y level shifter/logic circuit block 134 are described in detail below. FIG. 4 shows the detailed structure of the Y shift register 132 and the Y level shifter/logic circuit block 134.

The Y shift register 132 is constructed in the form of an m-stage shift register, each stage formed by a transfer unit circuit 136. The configuration and the operation of each transfer unit circuit 136 of the Y shift register 132 are similar to those of the transfer unit circuit 156 of the X shift register 152 described above with reference to FIG. 2.

The Y level shifter/logic circuit block 134 is similar in terms of configuration and operation to the X level shifter/logic circuit block 154 described earlier with reference to FIGS. 2 and 3.

In the present exemplary embodiment, the Y level shifter/logic circuit block 134 is formed in an m-stage configuration and is coupled with the Y shift register 132. As in the X level shifter/logic circuit block 154 described above with reference to FIG. 2, each stage of the Y level shifter/logic circuit block 134 is formed by a unit circuit 138. Each unit circuit 138, as with each unit circuit 158 of the X level shifter/logic circuit block 154, includes as main parts a waveform shaping circuit and an amplifier/logic circuit block. The waveform shaping circuit and the amplifier/logic circuit in the unit circuit 138 at each stage of the Y level shifter/logic operation circuit block 134 are similar, in terms of structure and operation, to the waveform shaping circuit 502 and the amplifier/logic circuit 504 described earlier with reference to FIGS. 2 and 3. In the Y circuits, as with the X circuits described above, the amplifier/logic circuit block at each stages of the Y level shifter/logic circuit block 134 may output second Y transfer pulses in positive logic and second Y transfer pulses in negative logic.

Thus, in the present exemplary embodiment, as shown in FIG. 4, scanning signals Y1, Y2, Y3, Y4, . . . , Ym−1, Ym are sequentially output from the unit circuits 138 at the respective stages of the Y level shifter/logic circuit block 134 in the direction from the first stage to the mth stage. Thus, in the image display area 110, as shown in FIG. 1, the scanning signals Y1, Y2, . . . , Ym are sequentially applied to the m scanning lines 112.

1-4: Example of Operation of Liquid Crystal Apparatus

Figure 5:
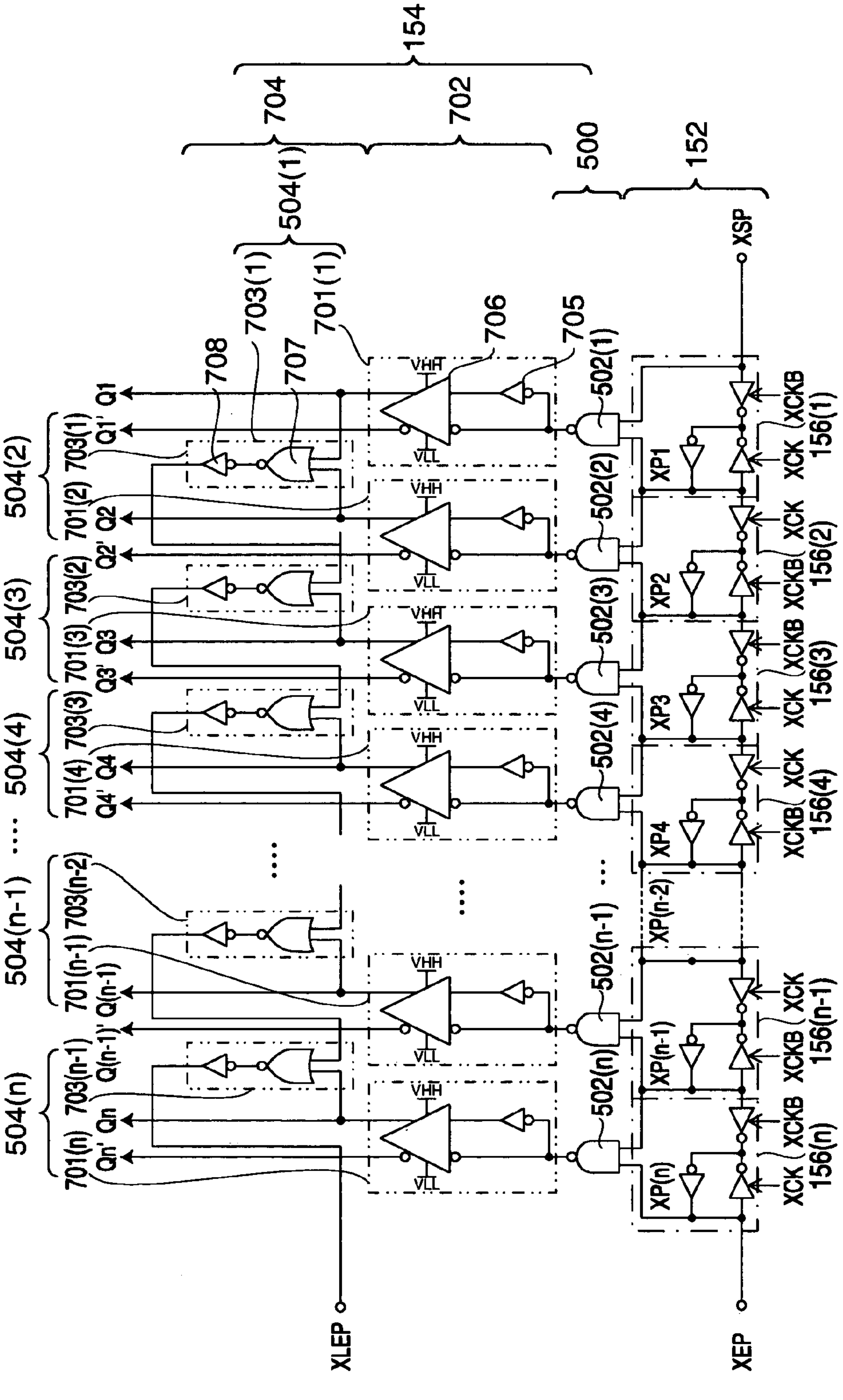
FIG. 5 is a schematic showing the detailed circuit configuration of the X shift register and the X level shifter/logic operation circuit block according to the first exemplary embodiment of the present invention.
Figure 6:
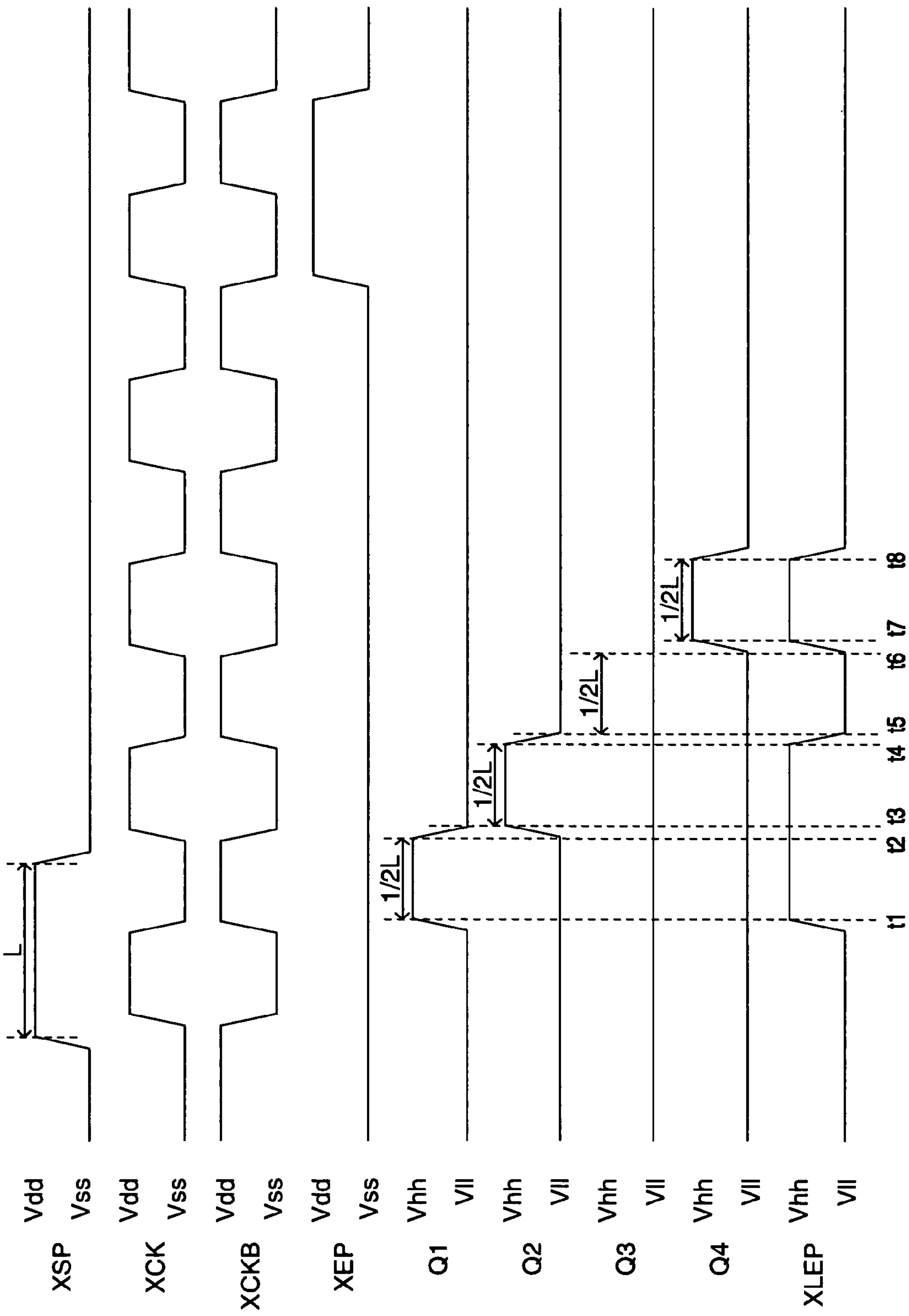
FIG. 6 is a timing chart showing states of main signals in the logic circuit shown in FIG. 4.

An example of an operation of a liquid crystal apparatus according to the present exemplary embodiment is described below. First, referring to FIGS. 5 and 6, driving of the data lines 114 of the liquid crystal panel 100 is described. FIG. 5 is a schematic showing a circuit to drive the data lines 114 of the liquid crystal panel 100. FIG. 6 is a timing chart showing changes with time in various signals associated with the operation of driving the data lines 114 of the liquid crystal panel 100.

FIG. 5 shows a specific example of the configuration of the X shift register 152 and the X level shifter/logic circuit block 154 formed by unit circuits 158(*i*) each including a waveform shaping circuit 502(*i*) and an amplifier/logic circuit block 504(*i*).

In FIG. 6, waveforms of an X transfer start pulse XSP, an X clock signal XCK, and an inverted X clock signal XCKB are shown. An Nth first-X-transfer-pulse XPn generated by the transfer unit circuit 156(*n*) at the Nth stage, that is, the last stage, of the X shift register 152 is output as an X end pulse XEP from the X shift register 152. The signal waveform of the X end pulse XEP is also shown in FIG. 6.

In the X level shifter/logic circuit block 154, each waveform shaping circuit 502 of the X enable device 500 is realized by a NAND circuit as shown in FIG. 5. The amplifier/logic circuit block 504 is formed by an amplifier unit circuit 701 and a logic circuit 703. Furthermore, in the present exemplary embodiment, an X level shifter 702 is formed by an amplifier unit circuit 701(*i*) at each stage of the X level shifter/logic circuit block 154.

Furthermore, in the present exemplary embodiment, the X level shifter/logic circuit block 154 also includes (n−1) logic circuits 703 and n amplifier unit circuits 701. In the present exemplary embodiment, the (n−1) logic circuits 703 form (n−1)-stage X logic operation device 704.

In FIG. 5, each amplifier unit circuit 701 of the X level shifter 702 includes an inverter 705 and an amplifier 706. In each stage of the X level shifter/logic circuit block 154, the amplifier 706 shifts the voltage level of the signal output from the waveform shaping circuit 502(*i*) and also shifts the voltage level of the signal that is inverted by the inverter 705 after being output from the waveform shaping circuit 502(*i*). The amplifier 706 outputs the second X transfer pulse as an X driving signal Qi and also outputs the logically inverted signal of the second X transfer pulse as a logically inverted signal Qi' of the X driving signal Qi.

As shown in FIG. 6, in the first stage of the X level shifter/logic circuit block 154, a first X driving signal Q1 generated from the signal output from the waveform shaping circuit 502(1) is at a high level for a period from time t1 to a time t2 and is output as a positive-logic signal. As shown in FIG. 6, the period during which the first X driving signal Q1 is output is controlled, by the waveform control by the waveform shaping circuit 502(1) at the first stage, so as to be one-half the period L during which the X transfer start pulse XSP is at the high level.

In the second stage of the X level shifter/logic circuit block 154, a second X driving signal Q2, generated from the signal output from the waveform shaping circuit 502(2), rises from the low level to the high level at the time t2, at which the first X driving signal Q1 falls from the high level to the low level, and is retained at the high level for a period from a time t3 to a time t4. During this period, the second X driving signal Q2 is output as a positive-logic signal. The period during which the second X driving signal Q2 is output is one-half the period L during which the X transfer start pulse XSP is at the high level. In the present exemplary embodiment, the waveform shaping circuit 502(1) at the first stage and the waveform shaping circuit 502(2) at the second stage perform waveform control such that there is no overlap between the period during which the first X driving signal Q1 is output and the period during which the second X driving signal Q2 is output.

In the third stage and in each of the following stages of the X level shifter/logic circuit block 154, the waveform shaping circuit 502(*i*) performs similar waveform control to that performed by the waveform shaping circuit 502(2) at the second stage. Thus, X driving signals Qi are sequentially output as positive-logic signals from the amplifiers 706 at the third stage and the following stages of the X level shifter/logic circuit block 154. At the same time, logically inverted signals Qi' of the X driving signals Qi are sequentially output as negative-logic signals from the amplifiers 706 of the respective stages of the X level shifter/logic circuit block 154.

Thus, in the present exemplary embodiment, the waveform control performs by the X enable device 500 ensures that there is no overlap in terms of time between the period during which an image signal Di is output in response to the ith X driving signal Qi and the period during which an image signal Di+1 is output in response to the (i+1)th X driving signal Qi+1. Therefore, in the present exemplary embodiment, it is possible to reduce the likelihood or prevent a continuous image signal from being written on data lines 114 at the same time thereby reducing or preventing an occurrence of a ghost.

In the X logic operation device 704 shown in FIG. 5, each logic circuit 703 is formed by a NOR circuit 707 and an inverter 708.

In the present exemplary embodiment, the NOR circuit 707 at the first stage of the X logic operation device 704 generates a transfer signal by performing a logical operation on the second X transfer pulse output as the first X driving signal Q1 from the first stage of the X level shifter 702 and the second X transfer pulse output as the second X driving signal Q2 from the second stage of the X level shifter 702.

In FIG. 6, during a period from the time t1 to the time t2, in which the first X driving signal Q1 is output, the NOR circuit 707 at the first stage of the X logic operation device 704 performs a logical operation on the first X driving signal Q1 and the second X transfer pulse output from the second stage of the X level shifter 702 thereby generating and outputting a transfer signal.

Similarly, during a period from a time t3 to a time t4 shown in FIG. 6, in which the second X driving signal Q2 is output, the NOR circuit 707 at the first stage of the X logic operation device 704 performs a logic operation on the second X transfer pulse output from the first stage of the X level shifter 702 and the second X driving signal Q2 thereby generating and outputting a transfer signal.

During a period after the time t4 shown in FIG. 6, the NOR circuit 707 at the first stage of the X logic operation device 704 performs a logic operation on the second X transfer pulse output from the first stage of the X level shifter 702 and the second X transfer pulse output from the second stage of the X level shifter 702 thereby generating and outputting a transfer signal.

The NOR circuit 707 at the second stage of the X logic operation device 704 performs a logic operation on the first-stage transfer signal input via the first-stage inverter 708 and the second X transfer pulse output, as the third X driving signal Q3, from the third stage of the X level shifter 702 thereby generating a transfer signal.

During a period from a time t5 to a time t6 shown in FIG. 6, in which the third X driving signal Q3 is output, the NOR circuit 707 at the second stage of the X logic operation device 704 performs a logic operation on the third X driving signal Q3 and the first-stage transfer signal thereby generating and outputting a transfer signal. During a period before the time t5 and during a period after the time t6, the NOR circuit 707 at the second stage of the X logic operation device 704 performs a logic operation on the second X transfer pulse output from the third stage of the X level shifter 702 and the first-stage transfer signal thereby generating and outputting a transfer signal.

At the third stage and the following stages of the X logic operation device 704, the NOR circuit 707 at the jth stage performs a logic operation on the (j−1)th-stage transfer signal input via the inverter 708 at the previous stage and the second X transfer pulse output as the (j+1)th X driving signal Qj+1 from the amplifier unit circuit 701(j+1) at the (j+1)th stage thereby generating and outputting a transfer signal.

Finally, in the X logic operation device 704, the logic circuit 703(n−1) at the (n−1)th stage performs a logic operation on the transfer signal output from the logic circuit 703(n−2) at the (n−2)th stage and the second X transfer pulse output from the Nth stage of the X level shifter 702 and thereby generating a transfer signal at the (n−1)th stage as the X test signal XLEP. Note that the number of X test signals XLEP output from the X logic operation device 704 is smaller than the number of stages, n, of the X shift register 152. The levels of the test signals XLEP change with time depending on changes in the sequentially-output second X transfer pulses.

As shown in FIG. 6, the X test signal XLEP is output from the X logic operation device 704 during a period from the time t1 to the time t8. If the X shift register 152 and the X level shifter 702 operate correctly, the X test signal XLEP is output from the X logic operation device 704 as a positive-logic signal that becomes high in level during the period from the time t1 to the time t8.

The X test signal XLEP changes with time depending on the second X transfer pulse sequentially output from the first to fourth stages of the X level shifter 702. Test signals associated with the respective stages from the first to fourth stages of the X shift register 152 and the X level shifter 702 appear sequentially in time in the X test signal XLEP.

Note that in the specific example shown in FIG. 6, the X test signal XLEP becomes low in a period from the time t5 to the time t6, because the amplifier 706 of the amplifier unit circuit 701(3) at the third stage of the X level shifter 702 does not operate correctly. Thus the third X driving signal Q3 becomes low in level, which appears in the X test signal XLEP. In this specific case, as shown in FIG. 6, the X test signal XLEP becomes low only in the period from the time t5 to the time t6 which corresponds to the third stage of the X level shifter 702.

Thus, in the present exemplary embodiment, by examining the X test signal XLEP, it is possible not only to test whether a part of the X shift register 152 and the X level shifter 702 operates correctly, but it is also possible to test whether the other part of the X level shifter 702 operates correctly and whether the overall operation is correct.

Note that, in the present exemplary embodiment, the number of X test signals XLEP is smaller than the number of stages, n, of the X shift register 152. This results in a great enhancement in efficiency of testing, compared with the case in which test signals associated with the respective n stages are separately output as n X test signals. By using only a single X test signal XLEP in which test signals associated with respective stages of the X level shifter 702 appear time-sequentially, it is possible to test all stages of the X level shifter 702. Alternatively, two X test signals XLEP may be used to test all stages of the X level shifter 702, for example, such that one X test signal XLEP is used to test stages in a right-hand half part of the X level shifter 702 shown in FIG. 5 and the other X test signal XLEP is used to test stages in a left-hand half part of the X level shifter 702. By performing logical operations in the above-described manner, it becomes possible to perform testing using a smaller number of X test signals XLEP than the number of the stages of the X shift register 152 or the X level shifter 702. This provides a very convenient testing method. In this technique, it is not necessary to provide a large number of test terminals in a limited area of a substrate on which the driving circuit 120 is formed. But it is sufficient to provide only one or a small number of test terminals depending on the number of X test signals XLEP. This is very advantageous in reducing the circuit size, circuit pitch or interconnection pitch. Furthermore, in the present exemplary embodiment, it is also possible to test any other internal circuit, such as the waveform shaping circuits 502(*i*) in the X enable device 500.

Furthermore, in the present exemplary embodiment, by examining the X test signal XLEP, it is also possible to easily test whether a particular part or all of stages of the X shift register 152 and the X level shifter 702 operate correctly.

Because the X test signal XLEP includes pulse components which appear sequentially in time and which originate from respective stages from the first stage to the final stage, the X level shifter 702 can be tested for all its stages by examining the X test signal XLEP, not at a particular instant, but over a period of one cycle of the operation of the X level shifter 702.

The X test signal XLEP may be output as a sequence of second X transfer pulses in positive logic starting from a second X transfer pulse output from the first stage of the X level shifter 702 and ending with a second X transfer pulse output from the Nth stage. Also in this case, the X shift register 152 and the X level shifter 702 operate correctly.

Thus, in the present exemplary embodiment, by examining the X test signal XLEP, it is possible to identify an abnormal part in the X shift register 152 or the X level shifter 702. Specifically, it is possible to identify a stage having a failure in the X shift register 152 or the X level shifter 702. This makes it unnecessary, when a failure is detected, to perform additional testing to identify the location at which a failure occurs in the X shift register 152 or the X level shifter 702, and it is possible to quickly repair the identified abnormal part.

Figure 7:
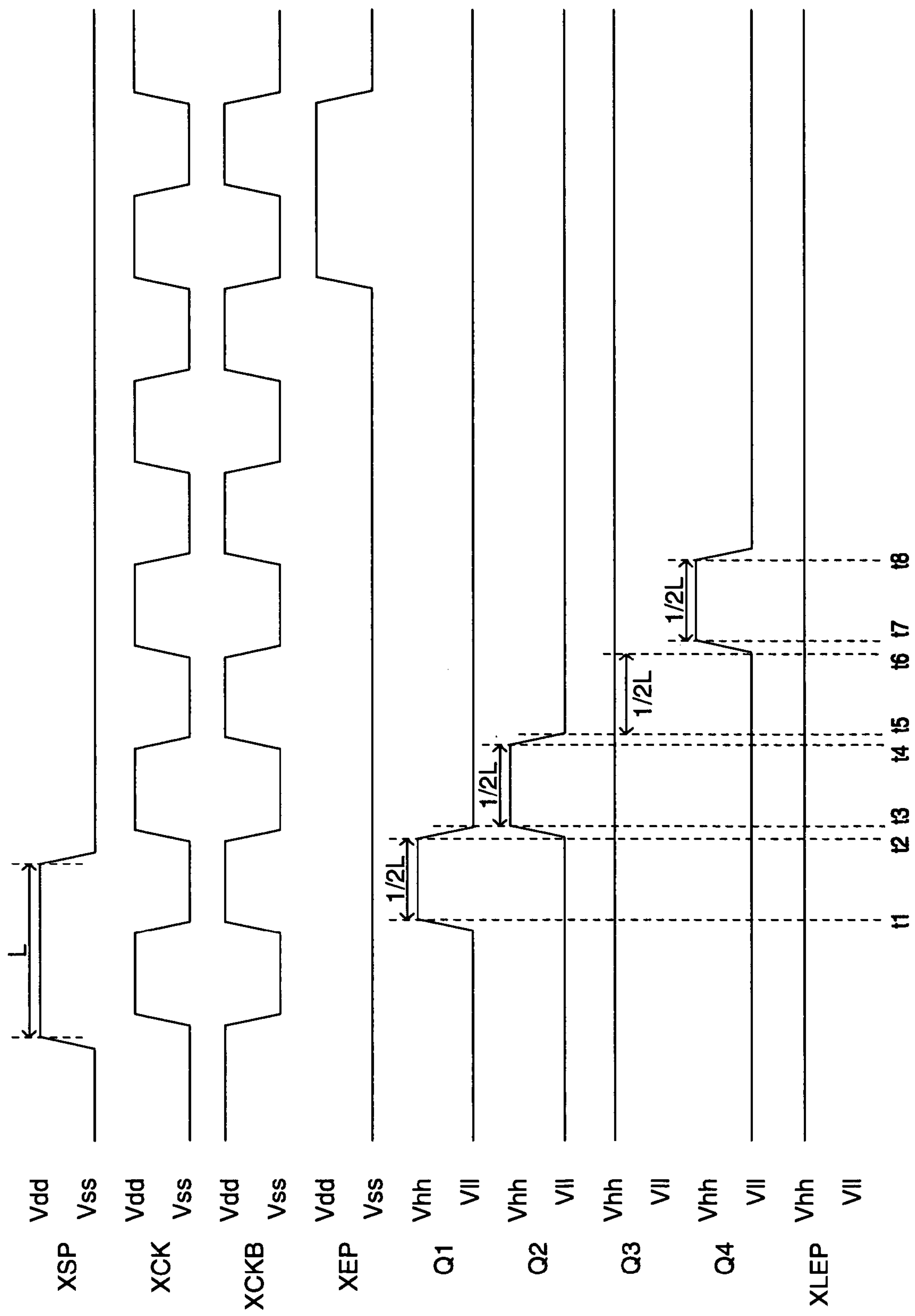
FIG. 7 is a timing chart showing states of main signals in the logic circuit shown in FIG. 4.

For example, if a short circuit occurs in an amplifier 706(3) in the amplifier unit circuit 701(3) at the third stage of the X level shifter 702, the second X transfer pulse output from the amplifier unit circuit 701(3) is always at the high level. FIG. 7 is a timing chart which is similar to that shown in FIG. 6. As shown in FIG. 7, in this case, the second X transfer pulse output as the third X driving signal Q3 from the third stage of the X level shifter 702 is always at the high level.

In this case, as shown in FIG. 7, the X test signal XLEP output from the X logic operation device 704 is always at the high level not only during the period from the time t1 to the time t8 but in any other period.

Thus, in the present exemplary embodiment, it is also possible to identify a cause of a failure in the X shift register 152 or the X level shifter 702 by examining the voltage level of the X test signal XLEP. This makes it unnecessary, when a failure is detected, to perform additional testing to identify the cause of the failure in the X shift register 152 or the X level shifter 702, and it is possible to quickly repair the identified abnormal part in the level shifter.

In the operation of the liquid crystal apparatus according to the present exemplary embodiment, the scanning lines 112 of the liquid crystal panel 100 are driven by the Y shift register 132 and the Y level shifter/logic circuit block 134. The Y shift register 132 and the Y level shifter/logic circuit block 134 are similar in structure and operation to the X shift register 152 and the X level shifter/logic circuit block 154 described above. That is, in the present exemplary embodiment, when the liquid crystal panel 100 is driven, the Y shift register 132 and the Y level shifter/logic circuit block 134 operate in a similar manner as described above with reference to FIGS. 5, 6, and 7. Thus, in the present exemplary embodiment, similar advantages to those obtained in the X circuits are also obtained in the Y circuits.

1-5: Modifications 1-5-1: Enable Device

Modifications of the X enable device and the Y enable device according to the above-described exemplary embodiments are described below.

Figure 8:
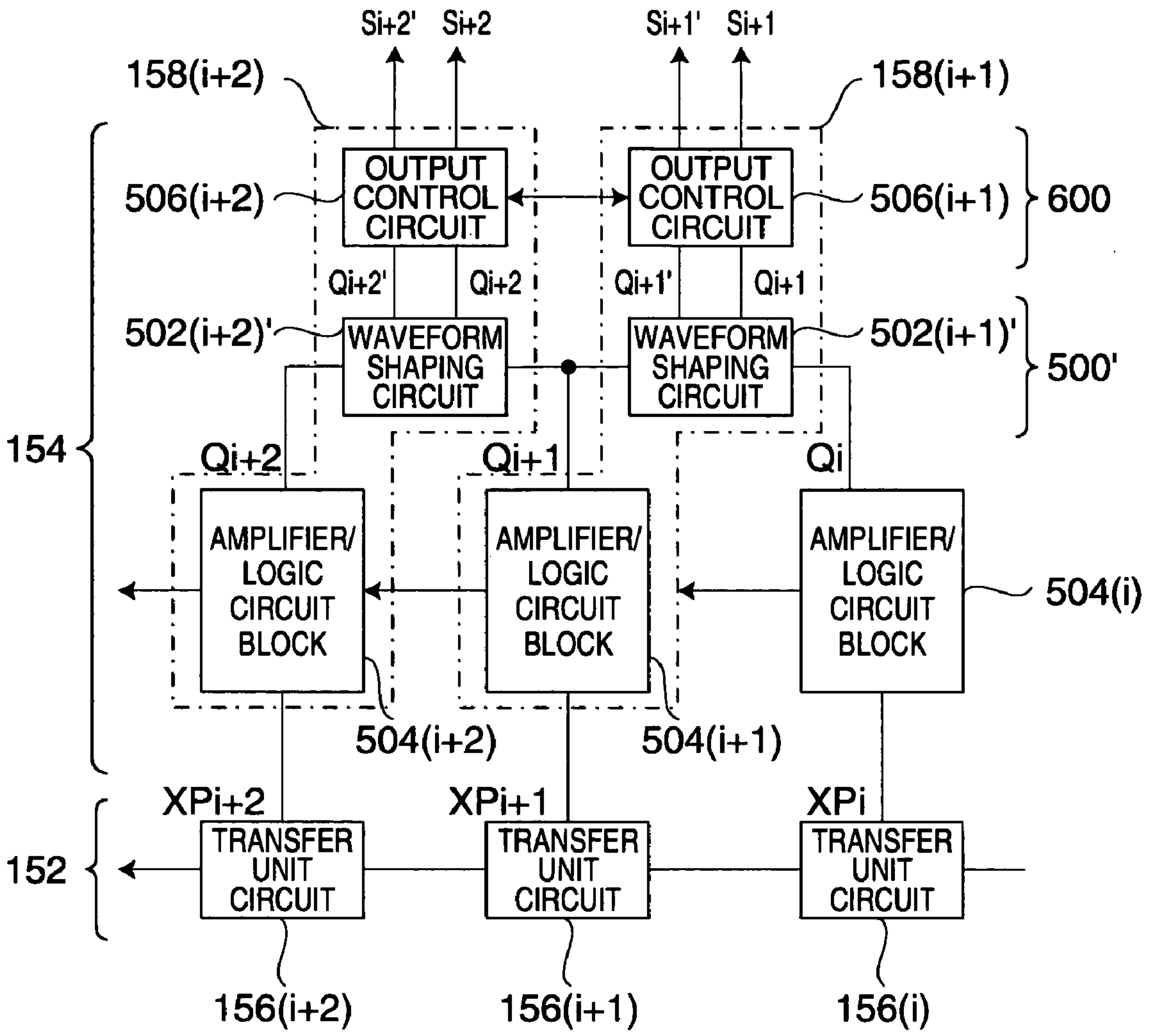
FIG. 8 is a schematic showing a modified configuration of the X level shifter/logic operation circuit block according to the first exemplary embodiment of the present invention.

Referring to FIG. 8, a modification of the X enable device 500 in the X level shifter/logic circuit block 154 is described. FIG. 8 illustrates an example of a modified circuit configuration of X enable device 500'. In this modification, the Y enable device is also modified, in terms of structure and operation, in a similar manner to the X enable device 500' described below, although the Y enable device is not described in detail below.

The modified X enable device 500' is different from the X enable device 500 according to the exemplary embodiment described above in that waveform control is performed on the X driving signal Qi. In the X enable device 500', unlike the X enable device 500 shown in FIG. 3, a waveform shaping circuit 502(*i*+1)' of the X enable device 500' is connected not to the input terminal of the amplifier/logic circuit block 504 but to the output terminal thereof, as shown in FIG. 8.

Therefore, in this modified X enable device 500', for example, in a unit circuit 158(i+1) at the (i+1)th stage shown in FIG. 8, a waveform shaping circuit 502(i+1)' performs waveform control on the (i+1)th X driving signal Qi+1 on the basis of the ith X driving signal Qi and the (i+1)th X driving signal Qi+1.

Also in this modification, the waveform control reduces the likelihood or prevents successive driving signals from being output at the same time thereby reducing or preventing an occurrence of a ghost or the like.

1-5-2: Logic Operation Device

In the exemplary embodiment described above, logic circuits of the X logic operation device and the Y logic operation device are formed using OR circuits. Alternatively, those logic circuits may be formed using NAND circuits as described below. An example of configuration of the X logic operation device using NAND circuits is described below. Note that the Y logic operation device is similar in structure and operation to the X logic operation device. Thus the Y logic operation device can also be configured using NAND circuits although not described below.

In this modification, each NAND circuit in the X logic operation device performs a logic operation on second X transfer pulses in negative logic input from corresponding amplifier unit circuits.

In this modification, if the X shift register and the X level shifter operate correctly, the X logic operation device outputs an X test signal in the form of a sequence of negative-logic pulses starting with a second X transfer pulse output from the first stage and ending with a second X transfer pulse output from the Nth stage.

In the case in which the logic circuits of the X logic operation device are formed using NOR circuits and NAND circuits, when the X shift register and the X level shifter operate correctly, the X logic operation device outputs the X test signal including a sequence of pulses in positive logic starting with a second X transfer pulse output from the first stage and ending with a second X transfer pulse output from the Nth stage and a sequence of pulses in negative logic starting with a second X transfer pulse output from the first stage and ending with a second X transfer pulse output from the Nth stage.

2: Second Exemplary Embodiment

An electro-optical apparatus according to a second exemplary embodiment of the present invention is described below. In the present exemplary embodiment, the X shift register 152 according to the first embodiment is used to sequentially output first X transfer pulses from the respective stages selectively in the forward direction or in the negative direction. The Y shift register 132 according to the first exemplary embodiment is also used to sequentially output first Y transfer pulses from the respective stages selectively in the forward direction or in the negative direction.

That is, the X shift register, the Y shift register, the X level shifter/logic operation circuit block, and the Y level shifter/logic operation circuit block, used in this exemplary embodiment, are similar in structure and operation to the corresponding circuits according to the first exemplary embodiment. The overall structure of the liquid crystal apparatus according to the present embodiment is also similar to that according to the first exemplary embodiment. Thus, similar parts to those in the first exemplary embodiment are denoted by similar reference numerals. The discussion herein is focused on parts different from those in the first exemplary embodiment.

Figure 9:
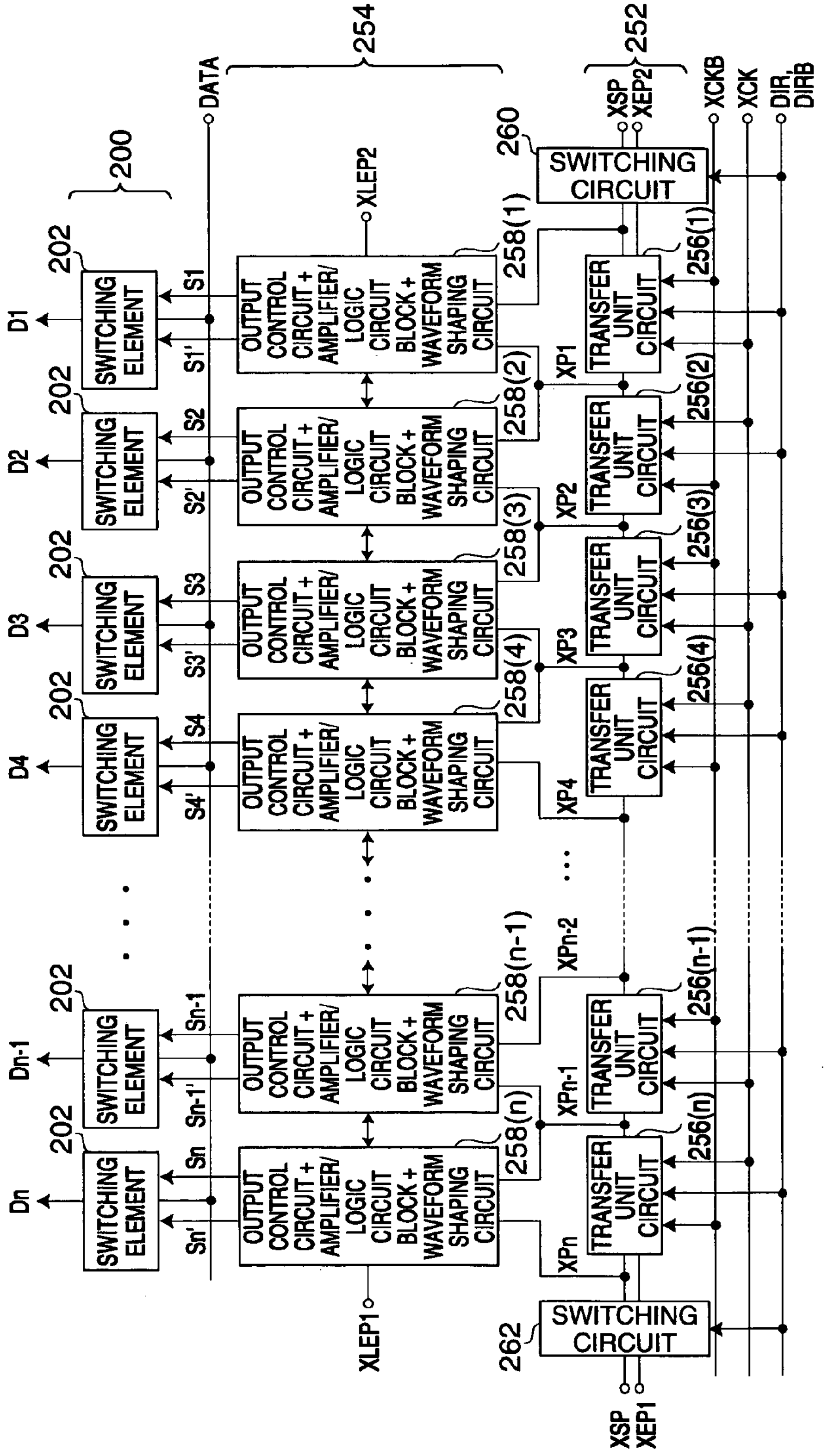
FIG. 9 is a schematic showing the structure of an X shift register and an X level shifter/logic operation circuit block according to a second exemplary embodiment of the present invention.

First, referring to FIG. 9, configurations of an X shift register 252 and an X level shifter/logic operation circuit block 254 are described in detail below. FIG. 9 is a schematic showing the detailed configurations of the X shift register 252 and the X level shifter/logic operation circuit block 254 according to the present exemplary embodiment.

In the present exemplary embodiment, the timing generator 400 described earlier with reference to FIG. 1 generates a forward control signal DIR and a reverse control signal DIRB and supplies the resultant forward control signal DIR and reverse control signal DIRB to the X shift register 252.

In the present exemplary embodiment, the X shift register 252 is similar to the X shift register 152 according to the first exemplary embodiment described earlier with reference to FIGS. 2, 3, and 5. That is, the X shift register 252 is configured in the form of an n-stage shift register using n transfer unit circuits 256.

As shown in FIG. 9, the forward control signal DIR and the reverse control signal DIRB supplied to the X shift register 252 are applied to the transfer unit circuits 256(*i*) at the respective stages of the X shift register 252. When the levels of the forward control signal DIR and the reverse control signal DIRB supplied to the X shift register 252 are such that the forward control signal DIR is high and the reverse control signal DIRB is low, the X shift register 252 performs transferring in the forward direction from the transfer unit circuit 256(1) at the first stage to the transfer unit circuit 256(*n*) at the Nth stage thereby sequentially outputting first X transfer pulses XP1, XP2, XP3, XP4, . . . , XPn−2, XPn−1, XPn in this order from the transfer unit circuits 256(*i*) at the respective stages.

When the levels of the forward control signal DIR and the reverse control signal DIRB supplied to the X shift register 252 are such that the forward control signal DIR is low and the reverse control signal DIRB is high, the X shift register 252 performs transferring in the reverse direction from the transfer unit circuit 256(*n*) at the Nth stage to the transfer unit circuit 256(1) at the first stage thereby sequentially outputting first X transfer pulses XPn, XPn−1, XPn−2, . . . , XP4, XP3, XP2, XP1 in this order from the transfer unit circuits 256(*i*) at the respective stages.

In the present exemplary embodiment, the X shift register 252 has a switching circuit 262 disposed at an end through which an X end pulse XEP1 is output when first X transfer pulses XPi are sequentially output in the forward direction. The X shift register 252 also has a switching circuit 260 disposed at the opposite end through which an X end pulse XEP2 is output when first X transfer pulses XPi are sequentially output in the reverse direction. The forward control signal DIR and the reverse control signal DIRB are respectively applied to the switching circuits 260 and 262.

In the X shift register 252, when the first X transfer pulses XPi are sequentially output in the forward direction, the X transfer start pulse XSP is input via the switching circuit 260 to the transfer unit circuit 256(1) at the first stage. The X end pulse XEP1 is output via the switching circuit 262 from the transfer unit circuit 256(*n*) at the Nth stage. In the X shift register 252, when the first X transfer pulses XPi are sequentially output in the reverse direction, the X transfer start pulse XSP is input via the switching circuit 262 to the transfer unit circuit 256(*n*) at the Nth stage. The X end pulse XEP2 is output via the switching circuit 260 from the transfer unit circuit 256(1) at the first stage.

The X level shifter/logic operation circuit block 254 according to the present exemplary embodiment is configured in a similar manner to the X level shifter/logic circuit block 154 according to the first exemplary embodiment described above with reference to FIGS. 2, 3, and 5. As shown in FIG. 9, the X level shifter/logic operation circuit block 254 includes n unit circuits 258 disposed at respective stages.

In the present exemplary embodiment, each unit circuit 258 of the X level shifter/logic operation circuit block 254 is similar in structure and operation to the unit circuit 158 according to the first exemplary embodiment described above with reference to FIGS. 2, 3, and 5.

In the X shift register 252, when the first X transfer pulses XPi are sequentially output in the forward direction, positive sampling signals S1, S2, S3, S4, . . . , Sn−1, Sn are sequentially output in the direction from the first stage to the Nth stage, and negative sampling signals S1', S2', S3', S4', . . . , Sn−1', Sn' are sequentially output. As a result, image signals D1, D2, D3, D4, . . . , Dn−1, Dn are sequentially applied, via the switching elements 202 of the sampling circuit 200, to the n data lines 114 in the image display area 110.

In the X shift register 252, when the first X transfer pulses XPi are sequentially output in the reverse direction, positive sampling signals Sn, Sn−1, . . . , S4, S3, S2, S1 are sequentially output in the direction from the Nth stage to the first stage, and negative sampling signals Sn', Sn−1', . . . , S4', S3', S2', S1' are sequentially output. As a result, in this case, in contrast to the above case in which the first X transfer pulses XPi are sequentially output in the forward direction, image signals Dn, Dn−1, . . . , D4, D3, D2, D1 are sequentially applied in the reverse direction, via the switching elements 202 of the sampling circuit 200, to the n data lines 114 in the image display area 110.

In the X level shifter/logic operation circuit block 254, as described earlier, (n−1)-stage X logic operation device formed by (n−1) logic circuits is disposed such that each stage thereof is coupled with a corresponding stage of a total of n stages of the X level shifter/logic operation circuit block 254. When the first X transfer pulses XPi are sequentially output in the forward direction, transfer signals are sequentially output from logic circuits at respective stages of the X logic operation device in the direction from the first stage to the (n−1)th stage. An X test signal XLEP1 is produced from the transfer signals sequentially output from the logic circuit at the (n−1)th stage.

When the first X transfer pulses XPi are sequentially output in the reverse direction, transfer signals are sequentially output from logic circuits at respective stages of the X logic operation device in the direction from the first stage to the (n−1)th stage. An X test signal XLEP2 is produced from the transfer signals sequentially output from the logic circuit at the first stage.

Therefore, in the present exemplary embodiment, when the X shift register 252 is in the forward operation state in which first X transfer pulses XPi are sequentially output in the forward direction, the X level shifter in the forward operation state can be tested for all stages thereof by examining the X test signal XLEP1 output from the X logic operation device. When the X shift register 252 is in the reverse operation state in which first X transfer pulses XPi are sequentially output in the reverse direction, the X level shifter in the reverse operation state can be tested for all stages thereof by examining the X test signal XLEP2 output from the X logic operation device.

Figure 10:
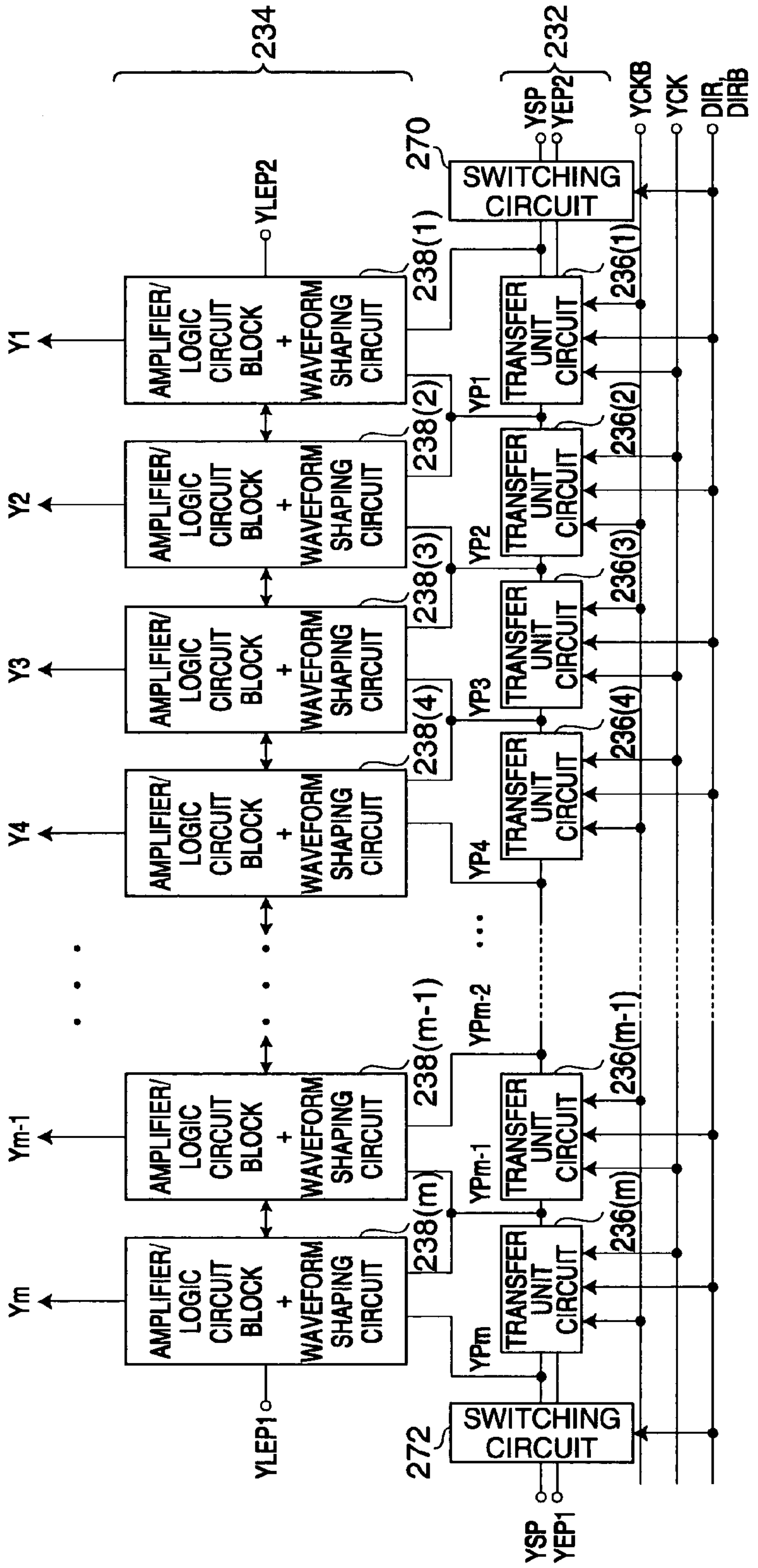
FIG. 10 is a schematic showing the structure of a Y shift register and a Y level shifter/logic operation circuit block according to the second exemplary embodiment of the present invention.

Now, referring to FIG. 10, the detailed structures of the Y shift register 232 and the Y level shifter/logic operation circuit block 234 according to the present exemplary embodiment are descried below. FIG. 10 is a schematic showing the detailed structures of the Y shift register 232 and the Y level shifter/logic operation circuit block 234 according to the present exemplary embodiment.

In the present exemplary embodiment, the forward control signal DIR and the reverse control signal DIRB generated by the timing generator 400 are also supplied to the Y shift register 232.

The Y shift register 232 according to the present exemplary embodiment is similar in structure and operation to the X shift register 252 descried above with reference to FIG. 9. The Y shift register 232 is constructed in the form of an m-stage shift register using m transfer unit circuits 236, as with the Y shift register 132 according to the first exemplary embodiment described above with reference to FIG. 4.

In the present exemplary embodiment, the Y shift register 232 has switching circuits 270 and 272 that are similar in structure and operation to switching circuit in the X shift register 252. In the Y shift register 232, the switching circuit 272 is disposed at an end through which a Y end pulse YEP1 is output when first Y transfer pulses YPi are sequentially output in the forward direction. The switching circuit 270 disposed at the opposite end through which a Y end pulse YEP2 is output when first Y transfer pulses YPi are sequentially output in the reverse direction.

The Y level shifter/logic operation circuit block 234 according to the present exemplary embodiment is configured in a similar manner to the Y level shifter/logic circuit block 134 according to the first exemplary embodiment described above with reference to FIG. 4. As shown in FIG. 10, the Y level shifter/logic operation circuit block 234 includes m unit circuits 238 disposed at respective stages. Each unit circuit 238 is similar in structure and operation to the unit circuit 138 according to the first exemplary embodiment described above with reference to FIG. 4.

In the Y shift register 232, when the first Y transfer pulses YPi are sequentially output in the forward direction, scanning signals Y1, Y2, Y3, Y4, . . . , Ym−1, Ym are sequentially output from the unit circuits 138 at the respective stages of the Y level shifter/logic circuit block 134 in the direction from the first stage to the mth stage. As a result, the scanning signals Y1, Y2, . . . , Ym are sequentially applied to the m scanning lines 112 in the image display area 110.

In the Y shift register 232, when the first Y transfer pulses YPi are sequentially output in the reverse direction, scanning signal Ym, Ym−1, . . . , Y4, Y3, Y2, Y1 are output sequentially in the direction from the mth stage to the first stage. As a result, scanning signal Ym, Ym−1, . . . , Y4, Y3, Y2, Y1 are sequentially applied to the m scanning lines 112 in the image display area 110 in a direction opposite to the direction in which first Y transfer pulses YPi are sequentially output in the forward direction.

When the first Y transfer pulses YPi are sequentially output in the forward direction, transfer signals are sequentially output from logic circuits at respective stages of the Y logic operation device of the Y level shifter/logic operation circuit block 234 in the direction from the first stage to the (m−1)th stage, and a Y test signal YLEP1 is produced from the transfer signals sequentially output from the logic circuit at the (m−1)th stage.

When the first Y transfer pulses YPi are sequentially output in the reverse direction, transfer signals are sequentially output from logic circuits at respective stages of the Y logic operation device in the direction from the (m−1)th stage to the first stage, and a Y test signal YLEP2 is produced from the transfer signals sequentially output from the logic circuit at the first stage.

Thus, in the present exemplary embodiment, similar advantages to those obtained in the X circuits are also obtained in the Y circuits described above with reference to FIG. 9.

In the present exemplary embodiment, each logic circuit in the X logic operation device and the Y logic operation device may be formed using a 3-input NOR circuit or a 3-input NAND circuit instead of or in addition to the 3-input NOR circuit.

In the case in which each logic circuit of the X logic operation device is formed using a 3-input NOR circuit, a transfer signal output from a previous stage in the forward transfer mode in which the first X transfer pulses XPi are sequentially output in the forward direction, a transfer signal output from a previous stage in the reverse transfer mode in which the first X transfer pulses XPi are sequentially output in the reverse direction, and a second X transfer pulse in positive logic output from a corresponding amplifier unit circuit are input to the NOR circuit. In the case in which each logic circuit is formed using a 3-input NAND circuit, a transfer signal output from a previous stage in the forward transfer mode in which the first X transfer pulses XPi are sequentially output in the forward direction, a transfer signal output from a previous stage in the reverse transfer mode in which the first X transfer pulses XPi are sequentially output in the reverse direction. A second X transfer pulse in negative logic output from a corresponding amplifier unit circuit are input to the NAND circuit.

Each logic circuit of the Y logic operation device can also be formed using a 3-input NOR circuit or a 3-input NAND circuit in a similar manner to the logic circuit in the Y logic operation device described above.

In the present exemplary embodiment, the X shift register 252 does not need to have switching circuits 260 and 262 used in the previous exemplary embodiment. The Y shift register 232 does not need to have switching circuits 270 and 272 used in the previous exemplary embodiment.

3: General Structure of Liquid Crystal Apparatus

Figure 11:
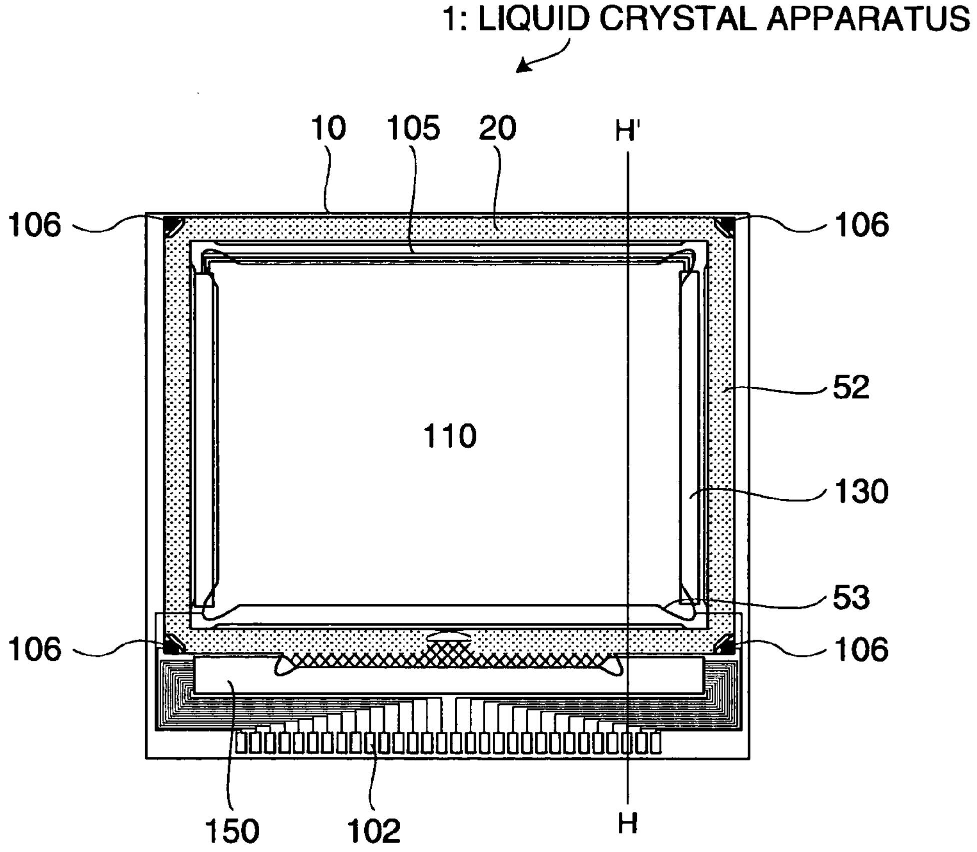
FIG. 11 is a schematic illustrating the general structure of a liquid crystal apparatus.
Figure 12:
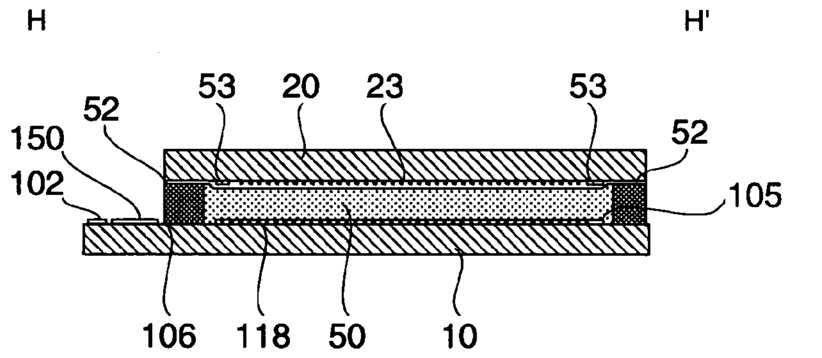
FIG. 12 is a cross-sectional schematic taken along plane H–H' of FIG. 11.

Referring to FIGS. 11 and 12, the general structure of the liquid crystal apparatus 1 according to the first and second exemplary embodiments of the present invention is described below. FIG. 11 is a schematic seen from the side of the opposite substrate 20. Various elements formed on the TFT array substrate 10 are shown. FIG. 12 is a cross-sectional schematic taken along plane H–H' of FIG. 11.

In FIGS. 11 and 12, a sealing material 52, such as a photo-setting resin, is disposed on the TFT array substrate 10 and around the image displaying area 110 (where an image is displayed by changing the orientation of the liquid crystal layer 50) in which a plurality of pixel electrodes 118 are disposed, in such a manner that the liquid crystal layer 50 is sealed within the space formed by bonding two substrates via the sealing material 52. The peripheral partition frame 53 opaque to light is disposed on the opposite substrate 20, at a location between the sealing material 52 and the image displaying area 110. The peripheral partition frame 53 opaque to light or a light blocking film 23 may be disposed on the TFT array substrate 10.

A scanning line driving circuit 130 including the Y shift register 132 and the Y level shifter/logic circuit block 134 is disposed outside the image display area 110 such that a part thereof is located to the left of the image display area 110 and the other part is located to the right of the image display area 110. In the case where a delay in driving of the scanning lines 112 is allowed, the scanning line driving circuit 130 may be disposed only on one side such that the scanning lines 112 are driven only from the one side.

In an area outside the sealing material 52, a data line driving circuit 150 including an X shift register 152 and a X level shifter/logic circuit block 154 and external-circuit connection terminals 102 to input signals supplied from the outside are disposed along the lower side of the image display area 110. A scanning line driving circuit 130 is disposed such that a part thereof is disposed in an area located in the outside of and along the left-hand side of the image display area 110. The remaining part of the scanning line driving circuit 130 is disposed in an area located in the outside of and along the right-hand side of the image display area 110. The data driving circuit 150 may be separated into two parts. One of them may be disposed in an area located in the outside of and along the upper side of the image display area 110. The other part may be disposed in an area located in the outside of and along the lower side of the image display area 110. In this case, for example, one part of the data line driving circuit 150 may be electrically connected with odd-numbered data lines. The other part of the data line driving circuit 150 may be electrically connected to even-numbered data lines, such that the data lines are driven in a comb fashion. A plurality of interconnections 105 to supply electric power and driving signals to the scanning line driving circuit 130 are disposed along the upper side of the image display area 110. An upper-to-lower conducting element 106 is disposed at least in one corner of the opposite substrate 20 so that the TFT array substrate 10 and the opposite substrate 20 are electrically connected via the conducting element 106. The opposite substrate 20 having an outer shape and a size similar to those of the sealing material 52 is bonded to the TFT array substrate 10 via the sealing material 52.

In the exemplary embodiments described above, the external control circuit to supply the clock signal and the image signal to the data line driving circuit 150 and the scanning line driving circuit 130 are disposed outside the liquid crystal apparatus. Alternatively, the control circuit may be disposed inside the liquid crystal apparatus.

Still alternatively, only a clock signal may be supplied from the outside, and an inverted clock signal may be generated by a circuit disposed on the substrate of the liquid crystal apparatus.

When the above-described liquid crystal apparatus 1 is used in a color liquid crystal projector, three similar liquid crystal apparatus 1 are used as RGB light valves, respectively. Light rays with different colors created through RGB color separation dichroic mirrors are passed through the respective liquid crystal apparatus. Therefore, in the exemplary embodiments described above, no color filter is disposed on the opposite substrate 20. However, in the liquid crystal apparatus 1, an RGB color filter with a protective film may also be formed on the opposite substrate 20, in proper areas corresponding to the pixel electrodes 118 where the light blocking film 23 is not formed. This allows the liquid crystal apparatus according to the present exemplary embodiment to be employed in a color liquid crystal apparatus of a type other than the liquid crystal projector, such as a direct-view-type or reflective-type color liquid crystal television set.

Each switching element of the liquid crystal apparatus 1 may be formed into the structure of a normal stagger type or coplanar type polysilicon TFT, or other types of TFTs, such as a reverse stagger type TFT or an amorphous silicon TFT may also be employed.

Furthermore, although in the liquid crystal apparatus 1 described above, a nematic liquid crystal is employed by example as the liquid crystal layer 50, a macromolecular dispersion type liquid crystal including a macromolecular material containing dispersed liquid crystal particles may also be employed. In this case, the alignment film, the polarizing film, and the polarizing plate become unnecessary. This allows an enhancement in the efficiency of using light. As a result, it is possible to realize a high-brightness and low-power liquid crystal panel.

4: Electronic Device

The liquid crystal apparatus 1 described above can be applied to various electronic devices as described below.

4-1: Projector

Figure 13:
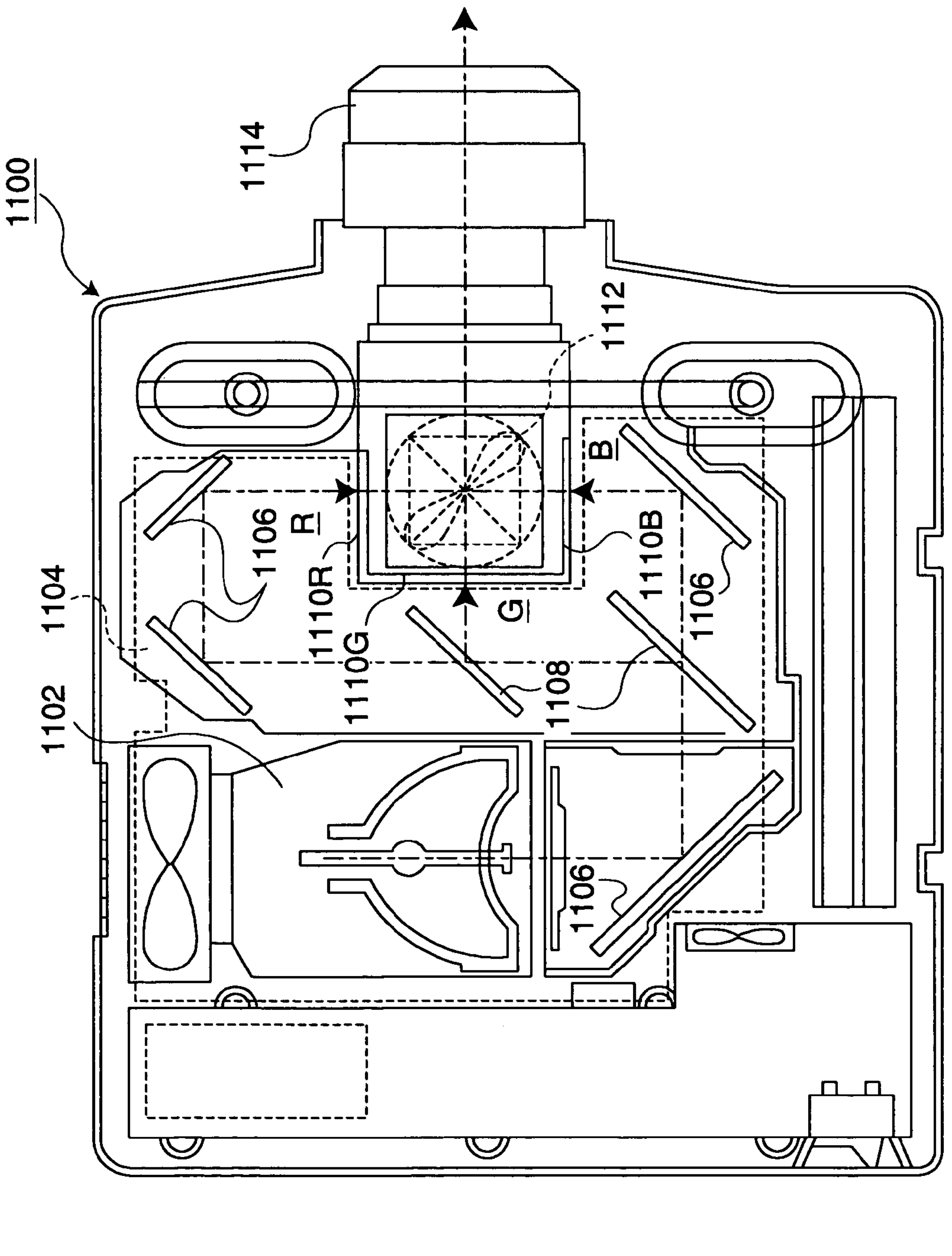
FIG. 13 is a schematic illustrating the structure of a projector which is an example of an electronic device using a liquid crystal apparatus.

First, a projector using liquid crystal apparatuses similar to the liquid crystal display apparatus 1 as light valves is described. FIG. 13 is a schematic illustrating an example of the structure of the projector. As shown in FIG. 13, the projector 1100 includes a lamp unit 1102 including a white light source, such as a halogen lamp. Projection light emitted from the lamp unit 1102 is divided, by four mirrors 1106 and two dichroic mirrors 1108 disposed in a light guide 1104, into three light rays with three primary colors RGB, which are incident on corresponding liquid crystal panels 1110R, 1110B, and 1110G serving as light valves for the respective primary colors.

The liquid crystal panels 1110R, 1110B, and 1110G are constructed in the same manner as the liquid crystal panel 100 described above. They are driven by three primary color signals R, G, and B supplied from an image signal processing circuit 300. The light rays modulated via the liquid crystal panels are incident on a dichroic prism 1112 from three different directions. The light rays R and B are bent by 90° by the dichroic prism 1112, whereas the light ray G directly passes through the dichroic prism 1112. As a result, images with the respective colors are mixed into a single image via the dichroic prism 1112, and the resultant color image is projected onto a screen via a projection lens 1114.

In this projector, it is required that images be produced by the respective liquid crystal panels 1110R, 1110B, and 1110G such that the image produced by the liquid crystal panel 1110G is horizontally inverted with respect to the images produced by the liquid crystal panels 1110R and 1110B.

In this projector, because light rays with three primary colors R, G, and B separated by the dichroic mirrors 1108 are incident on the liquid crystal panels 1110R, 1110B, and 1110G, respectively, no color filter is needed.

4-2: Mobile Computer

Figure 14:
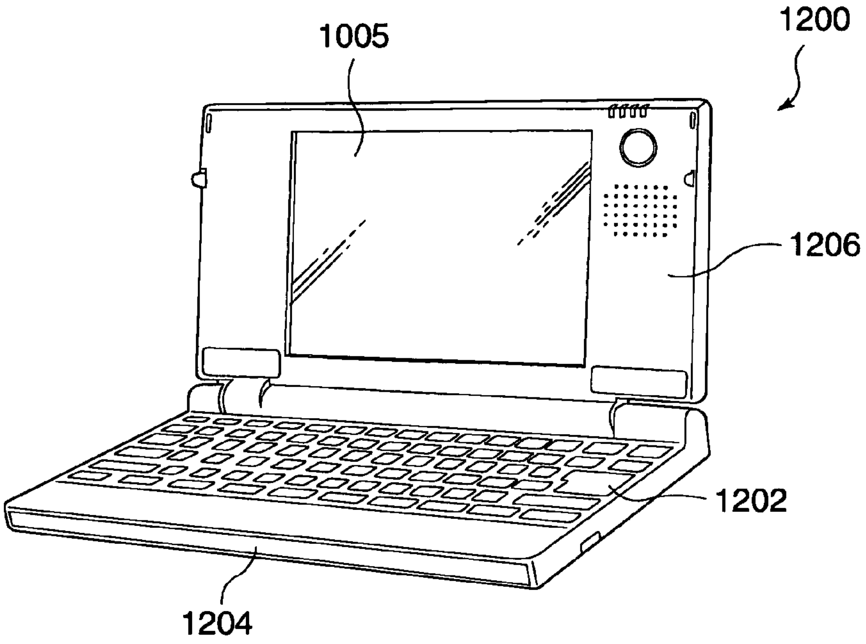
FIG. 14 is a schematic illustrating the structure of a personal computer which is an example of an electronic device using a liquid crystal apparatus.

As another example of an application of the liquid crystal display panel, a mobile computer is described below. FIG. 14 is a schematic showing the structure of the personal computer. As shown in FIG. 14, the computer 1200 includes a main part 1204 including a key board 1202, and a liquid crystal display unit 1206. This liquid crystal display unit 1206 is formed by disposing a backlight on the back of the liquid crystal display panel 1005 described above.

4-3: Portable Telephone

Figure 15:
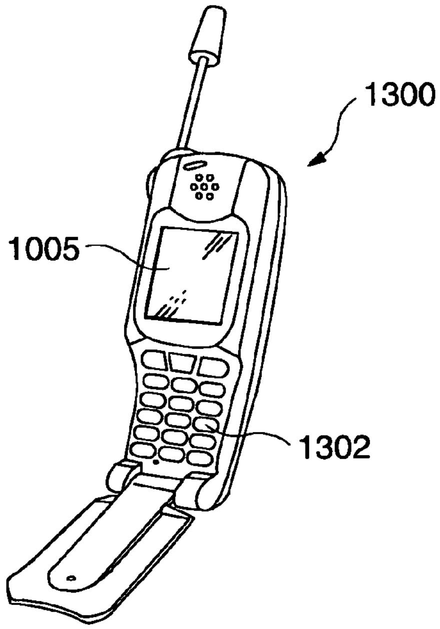
FIG. 15 is a schematic illustrating the structure of a portable telephone which is an example of an electronic device using a liquid crystal apparatus.

As still another example of an application of the liquid crystal display panel, a portable telephone is described below. FIG. 15 is a schematic of the portable telephone. As shown in FIG. 15, the portable telephone 1300 includes a reflective-type liquid crystal panel 1005 and a plurality of operation control buttons 1302. In this reflective-type liquid crystal panel 1005, a front light is disposed on the front surface thereof, if required.

In addition to the electronic devices described above with reference to FIGS. 13 to 15, the liquid crystal panel according to an aspect of the present invention may also be applied to various electronic devices, such as a liquid crystal television set, a video tape recorder having a viewfinder or a monitor, a car navigation system, a pager, an electronic notepad, an electronic calculator, a word processor, a work station, a video telephone, a POS terminal, and an apparatus with a touch panel.

The present invention is not limited to the details of the exemplary embodiments described above. Various modifications and changes are possible without departing from the scope and the spirit of the present invention. It should be understood that any driving circuit, any test method therefore, any electro-optical apparatus or electronic device including such a modification also falls within the scope of the present invention.

What is claimed is:

1. A driving circuit, comprising:

a shift register to sequentially output first transfer pulses from a plurality of stages of the shift register;

a level shifter to shift the levels of the sequentially-output first transfer pulses thereby sequentially outputting second transfer pulses as driving signals; and a logic operation device to perform a logic operation on the sequentially-output second transfer pulses thereby outputting test signals which change with time in response to changes in the sequentially-output second transfer pulses and the number of which is smaller than the number of stages, N, of the shift register.

2. A driving circuit, comprising:

a shift register to sequentially output first transfer pulses from a plurality of stages of the shift register; and a level shifter to shift the levels of the sequentially-output first transfer pulses thereby sequentially outputting second transfer pulses as driving signals, the level shifter including a logic operation device to perform a logic operation on the sequentially-output second transfer pulses thereby outputting test signals which change with time in response to changes in the sequentially-output second transfer pulses, and the number of which is smaller than the number of stages, N, of the shift register.

3. The driving circuit according to claim 1, the logic operation device including (N−1) stages of logic circuits that are disposed in correspondence with the stages of the shift register and that sequentially generate transfer signals;

a logic circuit at the first stage generating a first-stage transfer signal by performing a logic operation on a second transfer pulse output from a first stage of the level shifter and a second transfer pulse output from a second stage of the level shifter;

a logic circuit at the jth stage generating a jth-stage transfer signal by performing a logic operation on a transfer pulse output from a (j−1)th stage of the logic circuit and a second transfer pulse output from a (j+1)th stage of the level shifter, where j=2, . . . , N−1; and finally, a logic operation being performed on a transfer pulse output from an (N−2)th stage of the logic circuit and a second transfer pulse output from an Nth stage of the level shifter, thereby generating an (N−1)th-stage transfer signal as the test signal.

4. The driving circuit according to claim 3, the logic operation device generating the test signal such that when the shift register and the level shifter operate correctly, the test signal is in the form of a sequence of second transfer pulses starting with the first-stage second transfer pulse and ending with the Nth-stage second transfer pulse.

5. The driving circuit according to claim 4, the logic circuits formed using NOR circuits and performing the logic operation on the second transfer pulses in positive logic.

6. The driving circuit according to claim 4, the logic circuits formed using NAND circuits and performing the logic operation on the second transfer pulses in negative logic.

7. The driving circuit according to claim 4, the logic circuits formed using NOR circuits and NAND circuits such that the NOR circuits perform the logic operation on the second transfer pulses in positive logic, and the NAND circuits perform the logic operation on the second transfer pulses in negative logic.

8. The driving circuit according to claim 1, the shift register being configured to be capable of sequentially outputting the first transfer pulses selectively in a forward or reverse direction from the plurality of stages.

9. The driving circuit according to claim 3, further comprising:

an enabling device to control waveforms of (j−1)th, jth, and (j+1)th pulses of the first transfer pulse sequence or, instead, controlling waveforms of (j−1)th, jth, and (j+1)th pulses of the driving signals so that there is no overlap in time among the period during which the (j−1)th driving signal is output, the period during which the jth driving signal is output, and the period during which the (j+1)th driving signal is output.

10. A driving circuit according to claim 3, further comprising:

a sampling circuit including CMOS switching elements coupled with respective data lines of an electro-optical panel; and an output control device, a positive sampling signal corresponding to the driving signal being applied to one of thin film transistors that are different in conduction type and that form each CMOS switching element, a negative sampling signal that is a logically inverted signal of the positive sampling signal being applied to the other one of the thin film transistors that are different in conduction type and that form each CMOS switching element;

in response to the positive and negative sampling signals, each CMOS switching element samples an image signal supplied from the outside and supplies the resultant sampled image signal over a data line corresponding to the CMOS switching element; and the output control device controls outputting of the positive and negative sampling signals such that the positive and negative sampling signals are synchronously applied to the CMOS switching elements.

11. An electro-optical apparatus, comprising:

a driving circuit according to claim 1, and an electro-optical panel driven by sequentially-output driving signals.

12. An electronic device, comprising:

an electro-optical apparatus according to claim 11.

13. A test method of testing a driving circuit according to claim 1, comprising:

sequentially outputting first transfer pulses from the shift register;

sequentially outputting second transfer pulses via the level shifters; and producing a test signal by performing, using a logic operation device, a logic operation on the sequentially-output second transfer pulses and outputting the resultant test signal.

14. The test method according to claim 13, further comprising:

identifying an abnormal part of the level shifter on the basis of an abnormal part, in terms of voltage level as measured as a function of time, of the output test signal.

15. The test method according to claim 13, further comprising:

identifying a cause of an abnormal part of the level shifter on the basis of an abnormal part, in terms of voltage level, of the output test signal.

* * * * *